United States Patent
Holland et al.

(10) Patent No.: US 6,409,933 B1
(45) Date of Patent: Jun. 25, 2002

(54) PLASMA REACTOR HAVING A SYMMETRIC PARALLEL CONDUCTOR COIL ANTENNA

(75) Inventors: John Holland, San Jose; Valentin N. Todorow, Fremont; Michael Barnes, San Ramon, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/610,800

(22) Filed: Jul. 6, 2000

(51) Int. Cl.$^7$ .............................................. H01L 21/00
(52) U.S. Cl. ........................ 216/68; 343/893; 343/895
(58) Field of Search ........................... 343/895, 845, 343/852, 893; 216/68; 438/729; 118/723 I, 724, 715, 733

(56) References Cited

U.S. PATENT DOCUMENTS

| | | | |
|---|---|---|---|
| 3,573,840 A | 4/1971 | Gouillou et al. | 343/895 |
| 4,795,529 A | 1/1989 | Kawasaki et al. | 156/643 |
| 4,842,683 A | 6/1989 | Cheng et al. | 156/345 |
| 4,844,775 A | 7/1989 | Keeble | 156/643 |
| 4,849,675 A | 7/1989 | Muller | 315/111.51 |
| 4,872,947 A | 10/1989 | Wang et al. | 156/643 |
| 4,922,261 A | 5/1990 | O'Farrell | 343/742 |
| 4,948,458 A | 8/1990 | Ogle | 156/643 |
| 4,992,665 A | 2/1991 | Mohl | 250/423 R |
| 5,122,251 A | 6/1992 | Campbell et al. | 204/298.06 |
| 5,194,731 A | 3/1993 | Turner | 250/281 |
| 5,277,751 A | 1/1994 | Ogle | 156/643 |
| 5,280,154 A | 1/1994 | Cuomo et al. | 219/121.52 |
| 5,326,404 A | 7/1994 | Sato | 118/723 MR |
| 5,346,578 A | 9/1994 | Benzing et al. | 156/345 |
| 5,368,710 A | 11/1994 | Chen et al. | 204/192.32 |
| 5,401,350 A | 3/1995 | Patrick et al. | 156/345 |
| 5,540,824 A | 7/1996 | Yin et al. | 204/298.34 |
| 5,558,722 A | 9/1996 | Okumura et al. | 118/723 I |

(List continued on next page.)

FOREIGN PATENT DOCUMENTS

| | | |
|---|---|---|
| EP | 0 378 828 | 7/1990 |
| EP | 0 413 282 A3 | 2/1991 |
| EP | 0 489 407 A2 | 6/1992 |
| EP | 0 520 519 A1 | 12/1992 |
| EP | 0 596 551 A1 | 5/1994 |
| EP | 0 602 764 A1 | 6/1994 |
| EP | 0 710 055 A1 | 5/1996 |
| EP | 0 727 807 A1 | 8/1996 |
| EP | 0 727 923 A1 | 8/1996 |
| GB | 2 231 197 | 11/1990 |
| WO | WO 91/10341 | 7/1991 |
| WO | WO 92/20833 | 11/1992 |

OTHER PUBLICATIONS

U.S. Patent Application Serial No. 09/544,377, filed Apr. 6, 2000, entitled, "Inductively Coupled Plasma Source with Controllable Power Deposition," by Michael Barnes, John Holland, and Valentin Todorov.

Primary Examiner—Don Wong
Assistant Examiner—Shih-Chao Chen
(74) Attorney, Agent, or Firm—Michaelson and Wallace; Joseph Bach

(57) ABSTRACT

The invention is realized in a plasma reactor for processing a semiconductor workpiece. The reactor includes a vacuum chamber having a side wall and a ceiling, a workpiece support pedestal within the chamber and generally facing the ceiling, a gas inlet capable of supplying a process gas into the chamber and a solenoidal interleaved parallel conductor coil antenna overlying the ceiling and including a first plurality conductors wound about an axis of symmetry generally perpendicular to the ceiling in respective concentric helical solenoids of at least nearly uniform lateral displacements from the axis of symmetry, each helical solenoid being offset from the other helical solenoids in a direction parallel to the axis of symmetry. An RF plasma source power supply is connected across each of the plural conductors.

25 Claims, 18 Drawing Sheets

U.S. PATENT DOCUMENTS

| | | | |
|---|---|---|---|
| 5,710,486 A | 1/1998 | Ye et al. | 315/111.21 |
| 5,874,704 A | 2/1999 | Gates | 219/121.43 |
| 5,907,221 A | 5/1999 | Sato et al. | 315/111.51 |
| 5,919,382 A | 7/1999 | Qian et al. | 219/121.52 |
| 6,016,131 A | 1/2000 | Sato et al. | 343/895 |
| 6,020,686 A | 2/2000 | Ye et al. | 315/111.51 |
| 6,023,251 A | 2/2000 | Koo et al. | 343/700 |
| 6,036,878 A * | 3/2000 | Collins | 216/68 |
| 6,095,083 A * | 8/2000 | Rice et al. | 118/723.1 |
| 6,127,275 A | 10/2000 | Flamm | 438/710 |
| 6,164,241 A * | 12/2000 | Chen et al. | 118/723.1 |
| 6,308,654 B1 | 10/2001 | Schneider et al. | 118/723 |

* cited by examiner

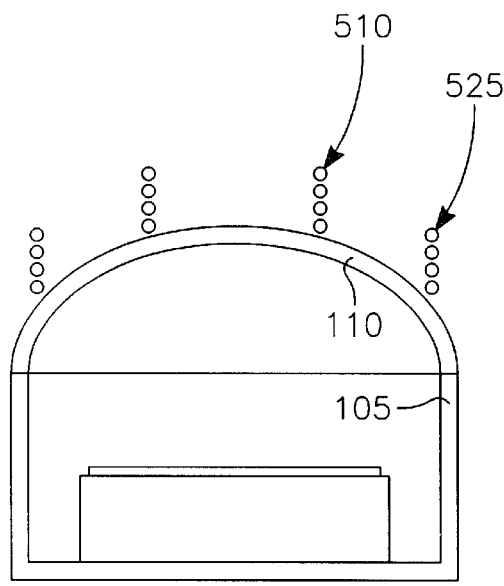
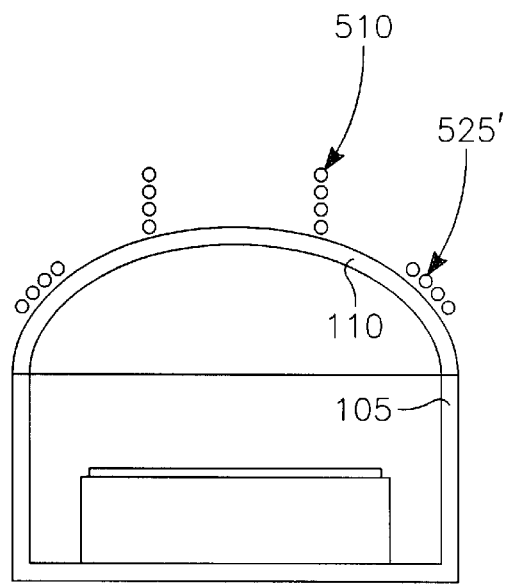
FIG. 9  FIG. 10
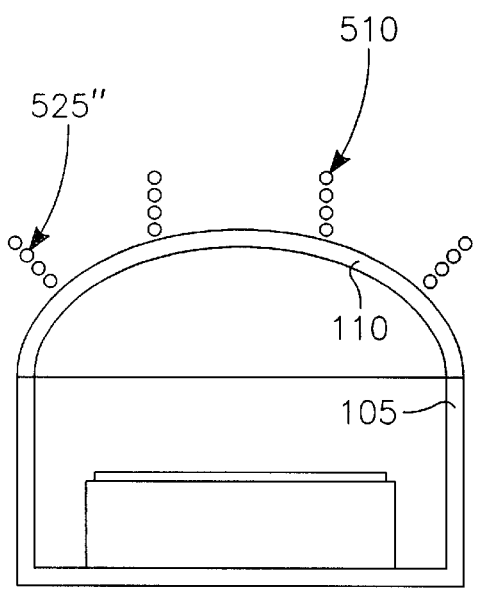
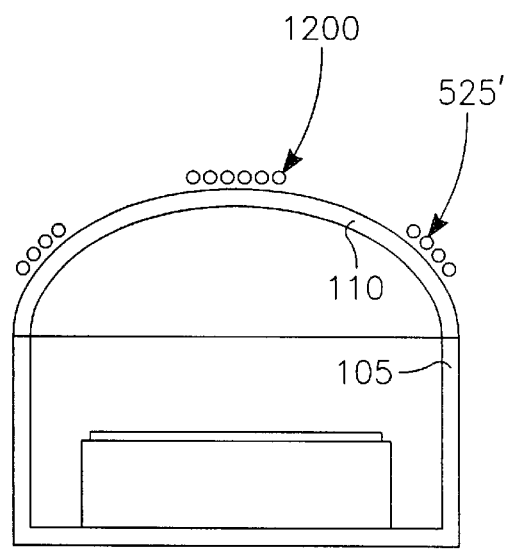
FIG. 11  FIG. 12

PLASMA REACTOR HAVING A SYMMETRIC PARALLEL CONDUCTOR COIL ANTENNA

BACKGROUND OF THE INVENTION

Plasma reactors used to fabricate semiconductor microelectronic circuits can employ RF inductively coupled fields to maintain a plasma formed from a processing gas. Such a plasma is useful in performing etch and deposition processes. Typically, a high frequency RF source power signal is applied to a coil antenna near the reactor chamber ceiling. A semiconductor wafer or workpiece support on a pedestal within the chamber has a bias RF signal applied to it. The power of the signal applied to the coil antenna primarily determines the plasma ion density within the chamber, while the power of the bias signal applied to the wafer determines the ion energy at the wafer surface. One problem with such a coil antenna is that there is a relatively large voltage drop across the coil antenna, which can induce unfavorable effects in the plasma such as arcing. This effect becomes more acute as the frequency of the source power signal applied to the coil antenna is increased, since the reactance of the coil antenna is proportional to frequency. In some reactors, this problem is addressed by limiting the frequency to a low range such as about 2 MHz. Unfortunately, at such lower frequencies, the coupling of RF power to the plasma can be less efficient. It is often easier to achieve a stable high density plasma discharge at frequencies in the range of 10 MHz to 20 MHz. Another disadvantage of operating at the lower frequency range (e.g., 2 MHz) is that the component size of such elements as the impedance match network are much larger and therefore more cumbersome and costly.

Another problem with coil antennas is that efficient inductive coupling to the plasma is generally achieved by increasing the number of turns in the coil which creates a larger the magnetic flux density. This increases the inductive reactance of the coil, and, since the circuit resistance (consisting primarily of the plasma resistance) remains constant, the circuit Q (the ratio of the circuit reactance to resistance) increases. This in turn leads to instabilities and difficulties in maintaining an impedance match over varying chamber conditions. Instabilities arise particularly where the coil inductance is sufficiently great so that, in combination with stray capacitance, self-resonance occurs near the frequency of the RF signal applied to the coil. Thus, the inductance of the coil must be limited in order to avoid these latter problems.

These problems have been largely solved by the invention of an inductive coil antenna having multiple interleaved symmetrically arranged conductors spiraling outwardly as set forth in U.S. Pat. No. 5,919,382 to Xue-Yu Qian et al. By dividing the antenna into multiple conductors in an interleaved symmetric pattern, the voltage drop is reduced because it is divided among plural conductors of the antenna. Thus, the frequency of the source power signal is not restricted as in a conventional coil antenna. This type of coil antenna is referred to in this specification as an"interleaved"coil antenna. Such an interleaved coil antenna is disclosed in various configurations including a flat pancake shape as well as a dome shape or a dome shape with a cylindrical skirt around the side walls or a flat pancake shape with cylindrical skirts around the chamber side wall (U.S. Pat. No. 5,919,382).

One limitation of coil antennas overlying the chamber ceiling (both conventional as well as the interleaved type) is that the mutual inductance between adjacent conductors in the antenna is generally in a horizontal direction —generally orthogonal from the vertical direction in which RF power must be inductively coupled to the plasma. This is one important factor that limits the spatial control of the power deposition to the plasma. It is a goal of the present invention to overcome this limitation in the spatial control of the inductive coupling.

Typically with "inner" and "outer" coil antennas, they physically are distributed radially or horizontally (rather than being confined to a discrete radius) so that their radial location is diffused accordingly. This is particularly true of the horizontal "pancake" configuration. Thus, the ability to change the radial distribution of plasma ion distribution by changing the relative apportionment of applied RF power between the inner and outer antennas is limited. This problem is particularly significant in processing semiconductor wafers with larger diameters (e.g., 300 mm). This is because as the wafer size increases, it becomes more difficult to maintain a uniform plasma ion density across the entire wafer surface. The radial distribution of plasma ion density can be readily sculpted by adjusting the radial distribution of the applied magnetic field from the overhead antenna. It is this field which determines plasma ion density. Therefore, as wafer size increases, a greater ability to sculpt or adjust the radial distribution of the applied RF field is required. Accordingly, it would be desireable to enhance the effect of the apportionment of applied RF power between the inner and outer antennas, and in particular to accomplish this by confining each of the inner and outer antennas to discrete or very narrow radial locations.

Another problem encountered with the use of inner and outer coil antennas is that the outer antenna typically has a significantly greater inductance than the inner antenna (because of the longer distances at the outer radii), so that they have vastly different impedances. As a result, the impedances of the two coils are not similar. This problem is more acute as the chamber size increases to accommodate the trend toward larger semiconductor wafers. One way around this problem is to use independent RF power sources to drive the inner and outer antennas. Since each power source has its own impedance match network, a disparity between the impedances of the inner and outer antennas is not a problem. However, another problem arises in that it is difficult or impractical to keep the two independent power sources in phase, so that undesirable effects arise due to the occurrence of constructive and destructive interference between the RF magnetic fields generated by the the two antennas as their RF currents wander in and out of phase. This problem is overcome in accordance with one aspect of the invention by employing a novel dual output RF power source having the ability to apportion different RF power levels to its two outputs. However, with such a single RF source, the disparity between the impedances of the inner and outer antennas is again a problem. It would therefore be desireable to facilitate at least near equalization of the impedances of the inner and outer coils without sacrificing the inductive coupling of either.

SUMMARY OF THE DISCLOSURE

One embodiment of the invention is realized in a plasma reactor for processing a semiconductor workpiece, the reactor including a vacuum chamber having a side wall and a ceiling, a workpiece support pedestal within the chamber and generally facing the ceiling, a gas inlet capable of supplying a process gas into the chamber and a solenoidal interleaved parallel conductor coil antenna overlying the ceiling and including a first plurality conductors wound about an axis of symmetry generally perpendicular to the ceiling in respective concentric helical solenoids of at least nearly uniform lateral displacements from the axis of symmetry, each helical solenoid being offset from the other helical solenoids in a direction parallel to the axis of symmetry. A RF plasma source power supply is connected across each of the plural conductors.

In another embodiment, the antenna is a solenoidal segmented parallel conductor coil antenna overlying the ceiling and including a first plurality conductors wound about an axis of symmetry generally perpendicular to the ceiling in respective concentric side-by-side helical solenoids, each helical solenoid being offset by a distance on the order of a conductor width of the plurality of conductors from the nearest other helical solenoids in a direction perpendicular to the axis of symmetry, whereby each helical solenoid has slightly different diameter.

In either embodiment, the reactor may further include an inner coil antenna overlying the ceiling and surrounded by and having a lateral extent less than the first solenoidal interleaved parallel conductor coil antenna, whereby the first parallel conductor coil antenna is an outer coil antenna. In one implementation, the reactor further includes a second RF plasma source power supply connected to the inner coil antenna whereby the respective RF power levels applied to the inner and outer antennas are differentially adjustable to control radial distribution of the applied RF field from the inner and outer antennas. However, in a preferred implementation, the RF plasma source power supply includes two RF outputs having differentially adjustable power levels, one of the two RF outputs being connected to the outer antenna and the other being connected to the inner antenna, whereby the respective RF power levels applied to the inner and outer antennas are differentially adjustable to control radial distribution of the applied RF field from the inner and outer antennas.

Preferably, the number of the first plurality of parallel conductors is greater than the number of the second plurality of parallel conductors and the lengths of the first plurality of parallel conductors are shortened accordingly, so as to bring the inductive reactance of the outer antenna at least nearer that of the inner antenna.

If the inner antenna is also a parallel conductor antenna, then preferably the number of the first plurality of parallel conductors is greater than the number of the second plurality of parallel conductors and the lengths of the first plurality of parallel conductors are shortened accordingly, so as to bring the inductive reactance of the outer antenna at least nearer that of the inner antenna.

The lateral displacements of the first plurality of conductors of the outer antenna preferably are uniform and the lateral displacements of the second plurality of conductors of the inner antenna preferably are uniform, whereby the inner and outer antennas are confined within respective narrow annuli of widths corresponding to the thickness of the conductors, whereby to maximize the differential effect of the inner and outer antennas on the radial distribution of applied RF field.

BRIEF DESCRIPTION OF THE DRAWINGS

FIGS. 9–13 illustrate various configurations of solenoidal interleaved conductor coil antennas with plasma reactors having dome-shaped reactor chamber ceilings.

DETAILED DESCRIPTION OF THE PREFERRED EMBODIMENTS

Figure 1:
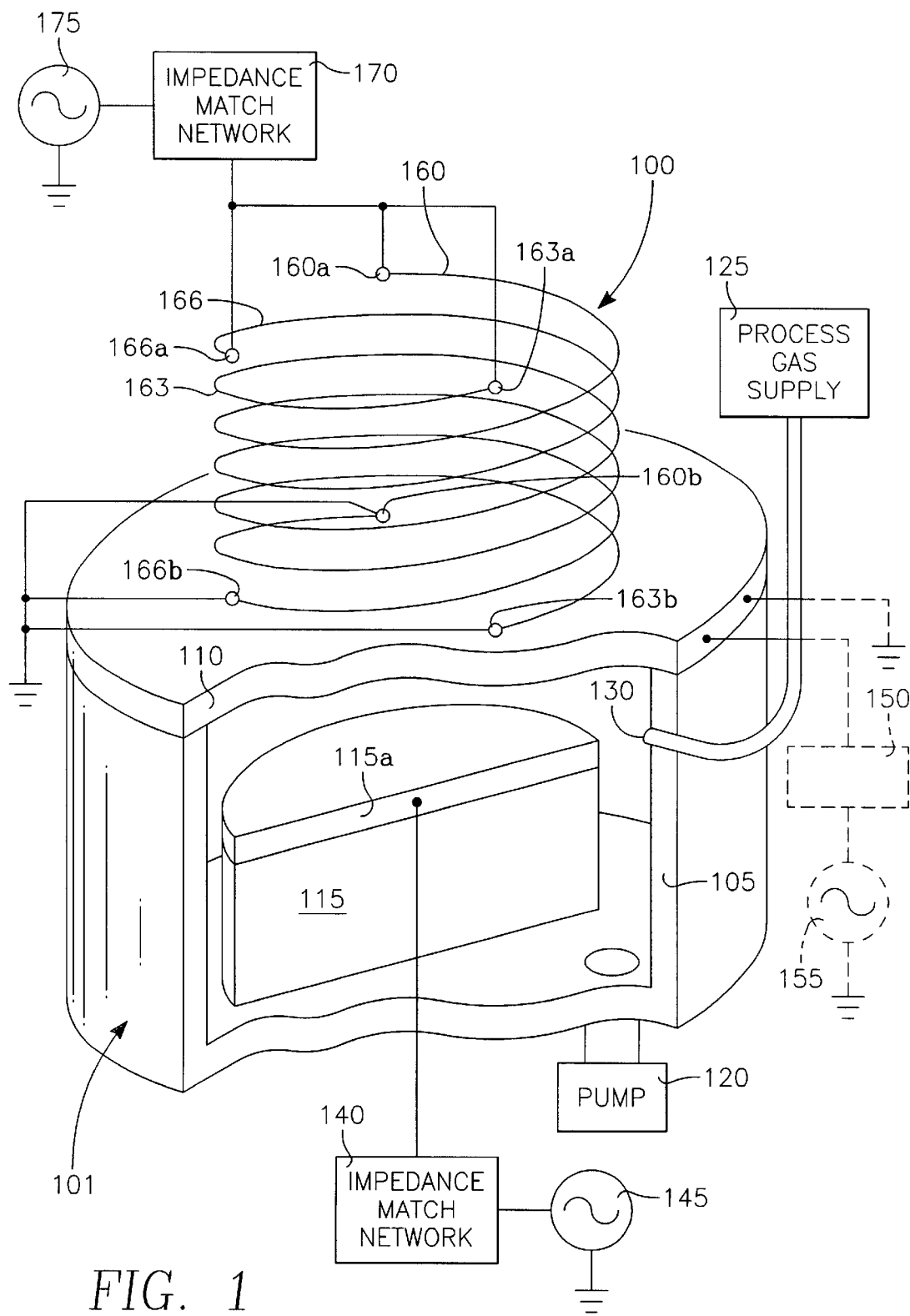
FIG. 1 illustrates a first embodiment of the invention having a single solenoidal interleaved plural conductor coil antenna.

Solenoidal Interleaved Coil Antenna:

Referring to FIG. 1, efficiency of inductive coupling to the plasma is enhanced by constructing the antenna 100 as a solenoidal multi-conductor interleaved coil antenna. In the illustrated embodiment, the solenoidal antenna 100 defines a vertical right circular cylinder or imaginary cylindrical surface or locus whose axis of symmetry coincides with that of the reactor vacuum chamber 101. It preferably further coincides with the axis of symmetry of a workpiece which may be accepted for processing. In FIG. 1, the reactor chamber 101 is defined by a cylindrical side wall 105 and a flat ceiling 110. A wafer support pedestal 115 is provided within the reactor chamber 101, oriented in facing relationship to the chamber ceiling and centered on the chamber axis of symmetry. A vacuum pump 120 cooperates with an exhaust outlet of the chamber. A process gas supply 125 furnishes process gas into the reactor chamber interior through a gas inlet 130. The process gas may contain a halide gas for polysilicon etching, a fluorocarbon gas for silicon dioxide etching, or silane gas for a silicon chemical vapor deposition process, for example. Or, the gas may contain a chlorine-bearing gas for metal etching, for example. The gas inlet 130 is illustrated in FIG. 1 as a single pipe but in practical application may be implemented through more elaborate structures such as multiple inlets.

Under the influence of RF power induced into the chamber from the antenna, such gases will support a plasma for processing the workpiece. Plasma processes which may be performed can include not only etch, but also deposition such as chemical vapor deposition, with the use of suitable precursor gases.

The pedestal 115 includes a conductive electrode 115*a* coupled through an impedance match network 140 to a bias RF power source 145. The chamber side wall 105 may be a metal such as aluminum while the ceiling 110 may be a dielectric such as quartz. In other embodiments of the invention, the ceiling 110 is not flat but may be dome shaped or conical. Moreover, the ceiling 110 may be a semiconductor rather than a dielectric, the semiconductive material of the ceiling 110 being of an optimum conductivity which enables it to act as a window to the RF inductive field from the antenna 100 as well as an electrode. How to determine the optimum conductivity for this purpose is disclosed in U.S. Pat. No. 6,077,384 to Kenneth S. Collins. In this case, where the ceiling 100 may be employed as an electrode, it may be grounded (as indicated in dashed line) or may be connected through a match network 150 to an RF power source 155, also indicated in dashed line. The chamber and/or antenna may have a shape other than cylindrical; for example it may be rectangular, and may have a square cross section. Workpieces also may be other than circular; for example they may be of square or other outer shape. Workpieces to be processed may be semiconductor wafers, or they may be other items such as mask reticles.

The interleaved solenoidal coil antenna 100 can include any number of interleaved conductors. In the embodiment of FIG. 1, the coil antenna consists of three interleaved symmetrically arranged conductors 160, 163, 166. The plural conductors of the antenna lie along respective helical paths generally paralleling each other. Each such helix conforms with the same imaginary right cylindrical surface, forming the solenoidal configuration. As illustrated, the helical conductors 160, 163, 166 are offset uniformly from one another in the vertical direction. More generally, the conductors are offset substantially uniformly from one another generally in the direction of the chamber axis of symmetry. Their power input taps 160*a*, 163*a*, 166*a*, respectively, are connected through an impedance match network 170 to an RF plasma source power supply 175. Their return taps 160*b*, 163*b* and 166*b*, respectively, are connected to ground. As illustrated, the power taps 160*a*, 163*a*, 166*a* preferably lie in the same horizontal plane in an imaginary circle, and are located along the circumference of that imaginary circle at uniform intervals which, in the case of three conductors, is 120. More generally, the aforesaid plane is transverse to the chamber axis of symmetry. Similarly, the return taps 160*b*, 163*b*, 166*b* are co-planar and disposed at uniform intervals (120). In this embodiment, the helical path of each conductor 160, 163, 166 slopes sufficiently in the axial direction to realize the generally uniform axial displacement between conductors while permitting the taps 160*a*, 163*a* and 166*a* to be co-planar. In other embodiments, the taps need not be co-planar.

In the embodiment of FIG. 1, the power tap and the return tap of each conductor are axially aligned (here, vertically aligned, since the chamber axis is shown as vertically oriented). For example, the power and return taps 160*a*, 160*b* of the conductor 160 are axially aligned. Preferably, the grounded ends of the windings are nearest the chamber ceiling 110, as illustrated in FIG. 1, in order to keep high potentials away from the plasma, and thereby minimizing any tendency for arcing and undesired capacitive coupling effects.

A principal advantage is that the inductive coupling is performed by plural conductors (e.g., the three conductors 160, 163, 166) rather than by a single conductor, so that for the same amount of inductive coupling, shorter conductor lengths may be employed. This feature greatly reduces the electrical potential drop along each conductor, and advantageously reduces capacitive coupling.

In this illustrated embodiment, the antenna 100 is symmetrically arranged about the axis of symmetry of the cylindrical reactor chamber side wall 105. Thus, for example, the input taps 160*a*, 163*a*, 166*a* at the top of the antenna 100 are spaced equally from the axis of symmetry of the cylindrical side wall 105 and from each other. Similarly, the output taps 160*b*, 163*b*, 166*b* at the bottom of the antenna 100 are spaced equally from the axis of symmetry of the cylindrical side wall 105 and from each other. Moreover, each conductor 160, 163, 166 is substantially the same shape, substantially evenly spaced with respect to each other about the axis of symmetry, and substantially of the same length. Preferably, the input and output taps of each conductor (e.g., the input and output taps 160*a*, 160*b*) are in vertical alignment with one another (i.e., along the axis of symmetry of the cylindrical side wall 105).

How the Solenoidal Coil Provides Better Coupling:

The solenoidal feature of illustrated embodiments of the invention increases the coupling to the plasma of the antenna because each conductor segment is displaced from its nearest neighbor conductor segment in the direction of the axis of symmetry. In this way the magnetic lines attributable to mutual coupling between the conductor segments are in the axial direction, so that they advantageously reach toward the plasma in the reactor chamber. Thus, coupling to the plasma is enhanced relative to designs in which the coils are flat with mutual coupling in the direction perpendicular to the chamber axis. In the embodiment of FIG. 1, the three conductors 160, 163, 166 are displaced axially from one another so that the mutual inductance between nearest neighbor conductors is generally in the chamber axial direction.

Figure 2:
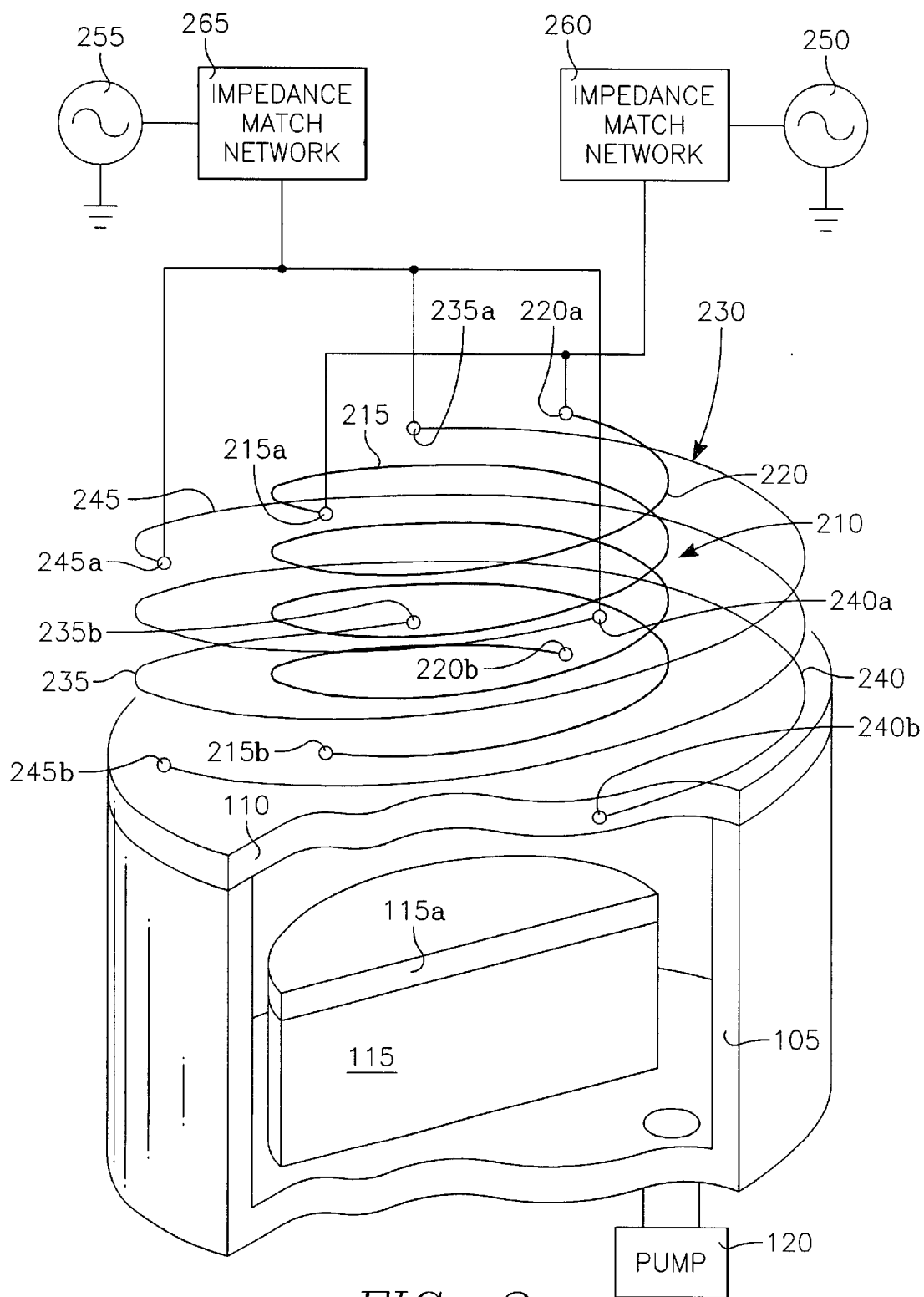
FIGS. 2, 3 and 4 are perspective, top and elevational views, respectively, of a second embodiment of the invention having inner and outer solenoidal interleaved plural conductor coil antennas.
Figure 3:
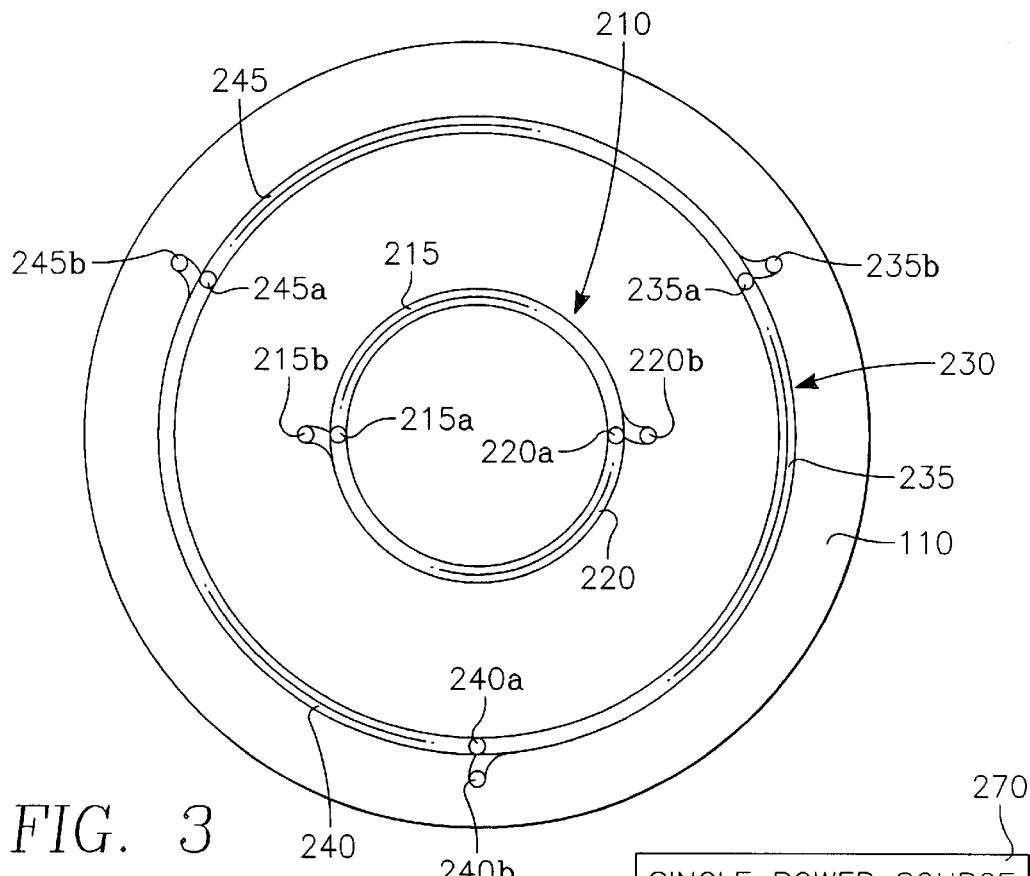
Figure 4:
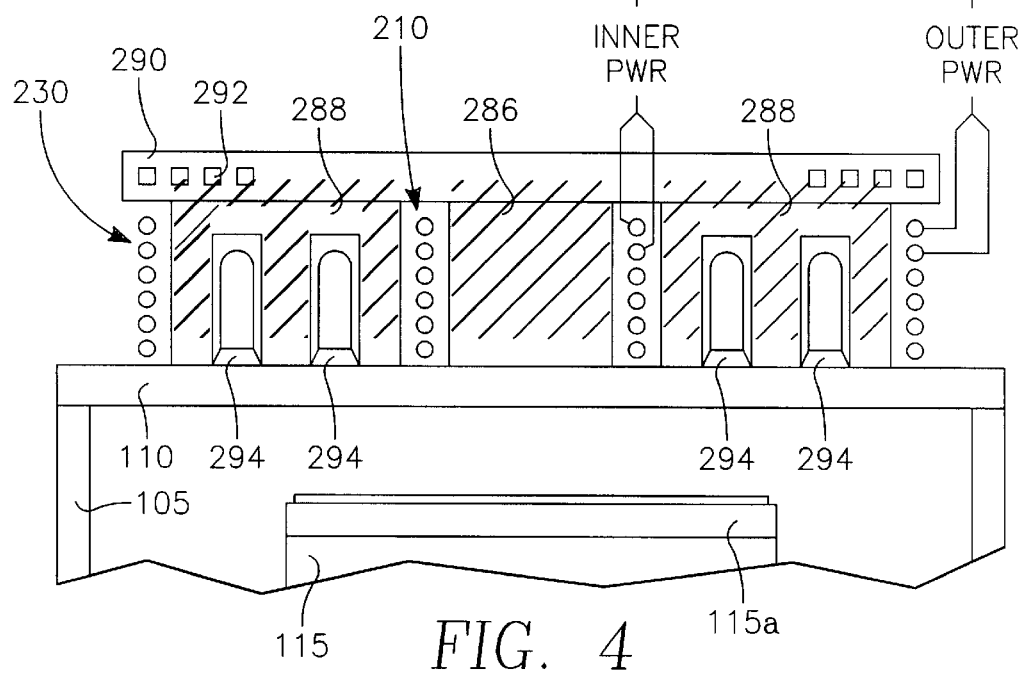

Inner and Outer Solenoidal Coil Antennas with Multiple Interleaved Conductors:

FIGS. 2–4 illustrate perspective, top and elevational views, respectively, of a reactor having inner and outer solenoidal antennas each having interleaved multiple conductors of the type illustrated in FIG. 1. An inner solenoidal antenna 210 has two interleaved conductors 215, 220 (rather than three as in FIG. 1). However, in other embodiments, a greater number of such interleaved conductors may be provided. The power terminals 215*a*, 220*a* are disposed at 180 degree angular separations from each other, as are the return terminals 215*b*, 220*b*. As in the embodiment of FIG. 1, the power and return terminals of each conductor 215, 220 of FIG. 2 are in vertical alignment, although in other implementations they may not be in axial alignment. Also as in the embodiment of FIG. 1, in FIG. 2 the power taps 215*a*, 220*a* lie in a top plane transverse to the axis while the return taps 215*b*, 220*b* lie in a bottom plane transverse to the axis. In the illustrated position, both of these transverse planes are horizontal. Each of the conductors 215, 220 is wound in a helix having a sufficient slope so that the 180 degree angular separation of the power taps 215*a*, 220*a* is sufficient to provide the axial offset between the conductors 215, 220 illustrated in FIG. 2.

An outer antenna 230 has three interleaved parallel conductors 235, 240, 245 with power taps 235*a*, 240*a*, 245*a* at 120 intervals in the top horizontal plane and return taps 235*b*, 240*b*, 245*b* at 120 intervals in the bottom horizontal plane. In order to facilitate adjustment of the radial distribution of plasma ion density, the power levels applied to each one of the inner and outer antennas 210, 230 must be separately or differentially adjustable. For this purpose, FIG. 2 illustrates two separate RF power sources 250, 255 coupled to the inner and outer antennas 210, 230 through respective impedance match networks 260, 265. One problem using separate power sources is that their output signals may tend to wander in and out of phase. As an alternative, FIG. 3 illustrates a common RF power source 270 with differentially adjustable dual outputs connected to the inner and outer antennas 210, 230. The dual output RF power source 270 is described later in this specification. Its principal advantage is that the separately adjustable RF signals applied to the inner and outer antennas 210, 230 are in phase, but their respective power levels may be adjusted relative to one another. The innovative design of the multiple coil antenna facilitates impedance matching and balancing as between the multiple coils, and the use of a common power source.

The elevational cut-away view of FIG. 4 shows how the discrete radial configuration of the inner and outer antennas 210, 230 overlies such a small area of the ceiling 110 that the remaining area provides more than sufficient space for the placement of temperature control elements over most of the ceiling area. Specifically, for example, the temperature control elements may include thermally conductive spacers 286, 288 contacting the top surface of the ceiling 110 at portions not underlying the inner and outer antennas 210, 230. The inner spacer 286 is a solid right cylinder surrounded by the inner antenna 210, while the outer spacer is a solid annulus flanked by the inner and outer antennas 210, 230. A cooling plate 290 overlies and contacts the top surfaces of the thermally conductive spacers 286, 288 and has coolant passages 292 extending therethrough in which a liquid coolant may be circulated. Furthermore, the spacers 286, 288 may have hollow spaces to accommodate heater lamps 294 facing the ceiling 110.

How the Solenoidal Inner/Outer Antennas Increase the Adjustment of the Radial Distribution of Plasma Ion Density:

Inner and outer antennas of the flat ("pancake") type tend to be distributed across a relatively large horizontal annulus so that their radial power deposition "locations" are not discretely defined. For example, some of the outer windings of the inner antenna are near the inner windings of the outer antenna. Thus, these RF currents flowing in the outermost windings of the inner antenna will have an effect on the coupling of inner windings of the outer antenna. Likewise, RF current flowing in the the innermost windings of the outer antenna will have an effect on the coupling of the outer windings of inner antenna. As a result, the positional effect of the inner and outer antennas is diffused and the radial power distribution can not be easily controlled by simply adusting the RF power applied to each coil. This reduces the extent to which they can shift the radial distribution of the RF field (and therefore of the radial distribution of the plasma ion density) for a given difference between the power levels applied to the inner and outer antennas.

In contrast, in the embodiment illustrated in FIGS. 2–4, the solenoidal inner and outer antennas 210, 230 whose plural conductors are offset from each other generally in the vertical direction (or more generally in the direction of the chamber axis) have virtually no radial width beyond that of the thin conductors themselves. This is best seen in the embodiment of FIG. 3, clearly showing that in the horizontal plane (or more generally a plane transverse to the chamber axis) the inner and outer antennas 210, 230 appear as two discrete concentric circles whose circular lines are thin. Thus, for example, all of the RF power applied to the outer antenna 230 radiates into the chamber from the location of the single discrete radius of the outer antenna, so that none of it is "wasted" at interior radial locations as in the conventional antenna mentioned above. The same is true of the inner antenna 210 in that all of the RF power applied to the inner antenna 210 radiates from the single discrete radius of the inner antenna 210. Thus, none of it is "wasted" at exterior radial locations. As a result, for a given range of differences in applied power levels on the inner and outer antennas 210, 230, a much greater shift in radial distribution of plasma ion density is realized than in the conventional case.

This feature provides a great advantage as the chamber size is scaled upwardly to accommodate larger semiconductor wafer sizes. As the wafer size increases, it becomes more difficult to maintain a uniform plasma ion density across the entire wafer surface or to adjust the distribution of the plasma ion density across the wafer surface. The radial distribution of plasma ion density is in large measure determined by the radial distribution of the applied inductive field. Therefore, the radial distribution of plasma ion density can be readily sculpted by adjusting the radial distribution of the applied inductive field from the overhead antenna. As wafer size increases, a greater ability to sculpt or adjust the radial distribution of the applied RF inductive field is required than previously possible. This need is now met by enhancing the effect of the apportionment of applied RF power between the inner and outer antennas, by: (a) confining each of the inner and outer antennas to discrete or very narrow radial locations, and (b) providing each of such antennas as plural symmetrically arranged conductors. This provides the basis for significantly enhanced impedance matching of different diameter antennas and power-apportioning capability, as well as minimizing voltage drop and undesired capacitive coupling effects, as set out in more detail below.

How the Impedances of the Inner and Outer Antennas Are Matched:

As mentioned previously in this specification, the larger dimensions of the outer antenna 230 dictate longer conductor lengths and therefore greater inductive reactance than the inner antenna 210. This creates problem in maintaining uniform potential differences across the reactor chamber and creates an impedance match problem if a common RF power source is employed. One aspect of the invention overcomes this problem by adjusting the length and number of the plural conductors in the interleaved coils of the inner as compared to the outer antenna. In particular, the outer antenna is provided as a greater number of individual interleaved conductors than the inner antenna. Moreover, each of the conductors of the outer antenna is proportionately shorter. The proportion of the number of interleaved conductors and conductor lengths between the inner and outer antennas is sufficient to reduce the disparity between the impedances of the inner and outer antennas.

Thus, the problem is solved in one aspect of the invention by reducing the inductance (length) of each of the conductors in the outer antenna 230. In order to avoid a concomitant reduction in the overall inductive coupling of the outer antenna 230, a greater number of individual conductors is provided in the outer antenna 230 than in the inner antenna 210. Specifically, while the inner antenna 210 has only two conductors with taps disposed at 180, the outer antenna 230 has three conductors with taps disposed at 120, as shown in FIGS. 2–4. The greater number of conductors for the other antenna enhances inductive coupling in order to compensate for the shorter individual conductor length. Further, each of the shorter conductors exhibits a much reduced voltage drop as compared with the use of a similar single conductor antenna, thus cutting undesired capacitive coupling effects.

Figure 5:
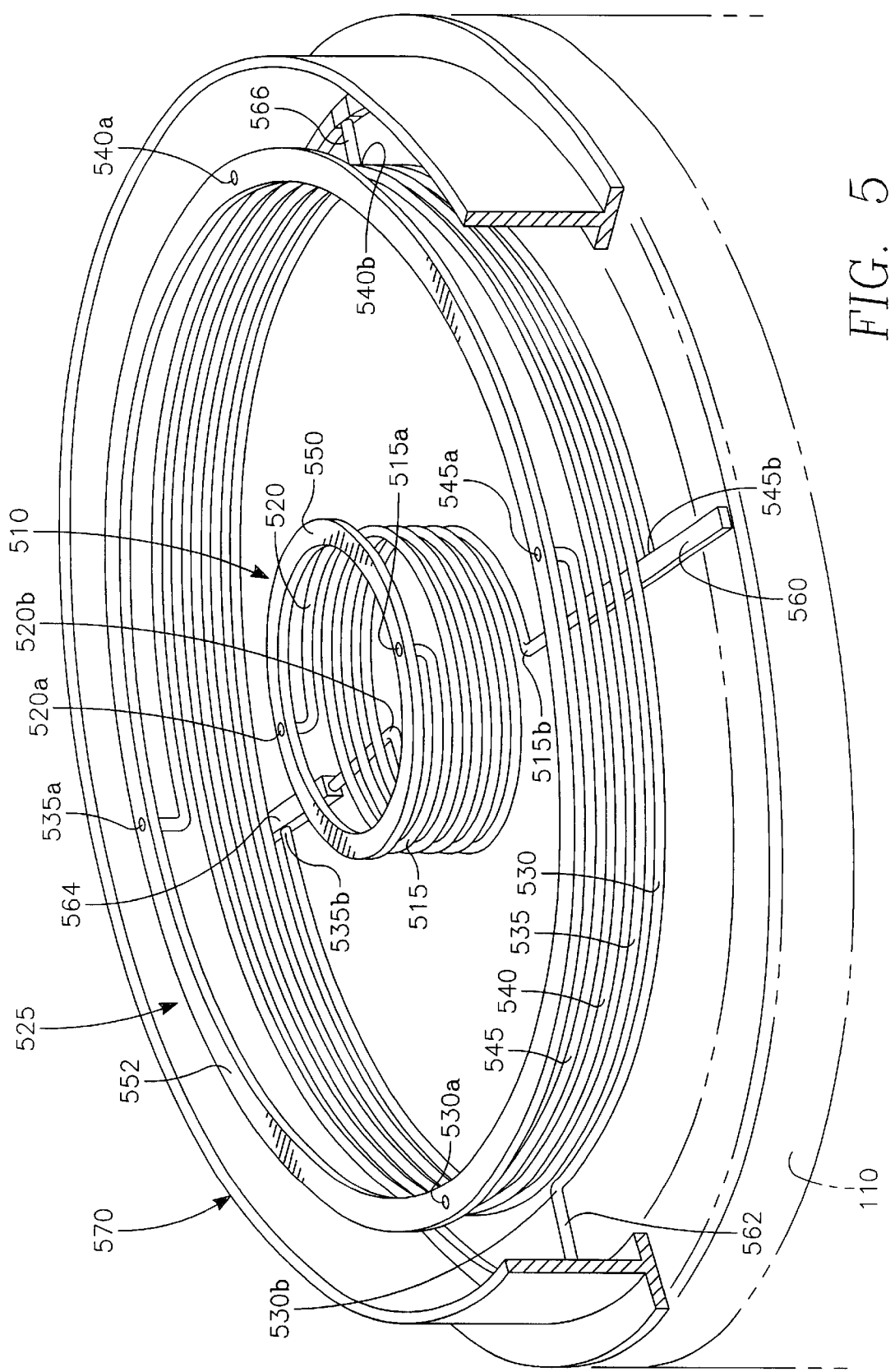
FIG. 5 is a perspective view of a first preferred embodiment of the invention having inner and outer solenoidal interleaved conductor coil antennas.

First Integrated Embodiment:

FIG. 5 illustrates a first integrated embodiment having multiple solenoidal overhead antennas, each having a plurality of interleaved conductors. An inner solenoidal antenna 510 has a pair of interleaved conductors 515, 520 with power taps 515a, 520a at 180 intervals. An outer solenoidal antenna 525 has four interleaved conductors 530, 535, 540, 545 with power taps 530a, 535a, 540a, 545a at 90 degree intervals with respect to the axis of symmetry. Each interleaved conductor is generally parallel to the remaining conductors of a given antenna. An inner circular power bus 550 overlying the inner antenna 510 is connected to the inner antenna power taps 515a, 520a. Similarly, an outer circular power bus 552 overlying the outer antenna 525 is connected to the outer antenna power taps 530a, 535a, 540a, 545a. A set of four arms 560, 562, 564, 566 underlying the outer antenna 525 and disposed at 90 degree intervals connect respective ground taps to a circular grounded housing 570. Two of the arms 560, 564 opposing one another at 180 degree intervals are connected to the inner antenna ground taps 515b, 520b, respectively and to outer antenna ground taps 530b, 540b. The remaining two opposing arms 562, 566 are connected to the outer antenna ground taps 535b, 545b. For each one of the plural conductors of a given antenna in FIG. 5, the power tap and the ground tap are in axial alignment.

Further, the power and ground taps of both the inner and outer antennas are colinear, and in axial alignment, although alternative embodiments are possible in which they need not be aligned. The multiple conductors and symmetric design facilitates the use of such aligned taps both within each individual coil and as between multiple coils, greatly simplifying RF power input to the antennas and minimizing cross-talk, stray reactances, and the possibility of nonuniformities in the plasma.

Figure 6A:
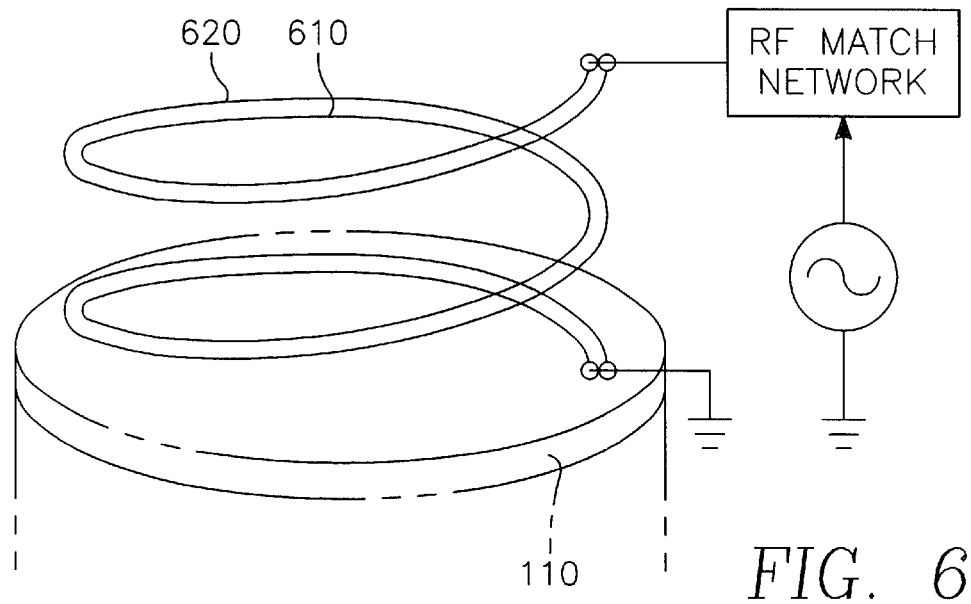
FIGS. 6A and 6B are perspective and top views, respectively, of another embodiment of the invention having a single solenoidal segmented plural conductor coil antenna.
Figure 6B:
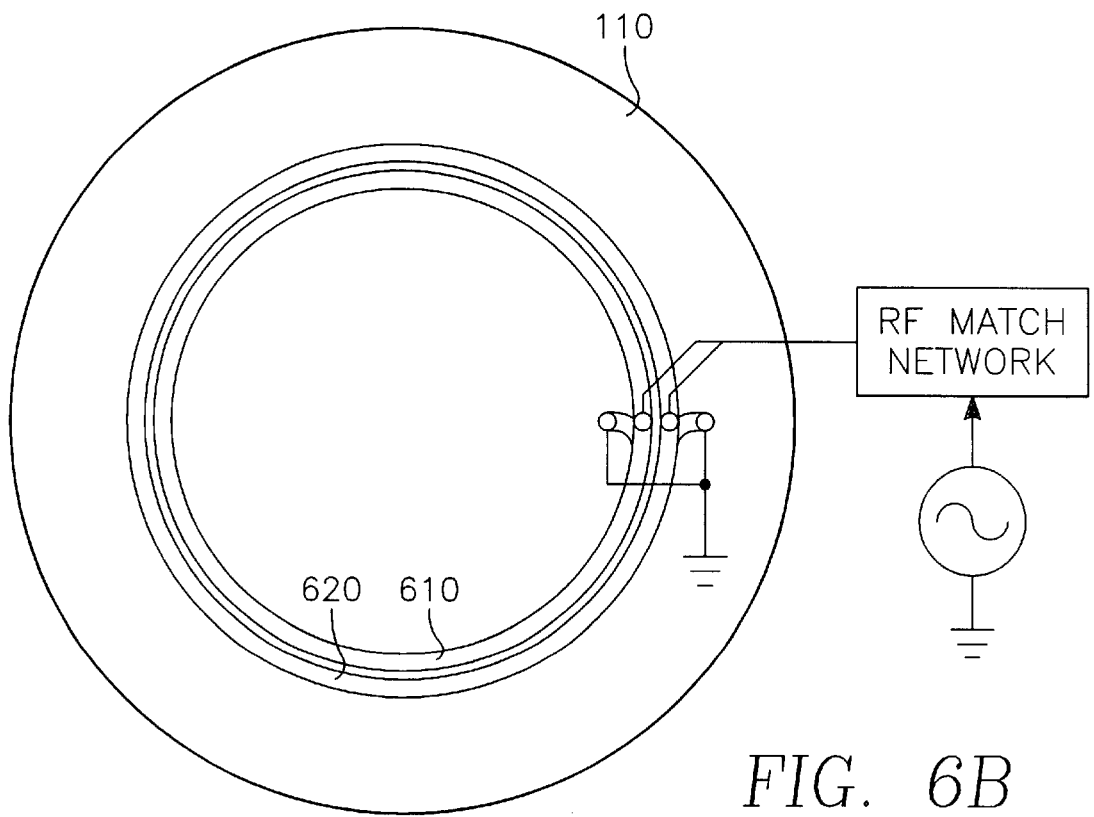

Segmented Side by Side Solenoidal Conductors:

FIGS. 6A and 6B illustrate an alternative embodiment of a single solenoidal plural-conductor coil antenna in which the plural conductors are not interleaved (as in the type of coil illustrated in FIG. 1 for example), but rather are segmented into parallel side-by-side conductors 610, 620, thus forming a solenoidal antenna which can be thought of as comprised of individual side by side segmented conductors. The top view of FIG. 6B clearly shows how such segmented conductors are side-by-side, rather than being displaced axially in the direction of the chamber axis or as illustrated, vertically. As in the interleaved embodiments, the side by side plural conductors of a given antenna are also symmetrically arranged about the axis along helical paths substantially parallel to each other. One of the conductors 610,620 has a slightly larger helical radius than the other, so that the conductor 610 is the inner segment and the conductor 620 is the outer segment. The side-by-side conductors 610, 620, function, however, as a single antenna because they are closely spaced together. For example, in the illustrated embodiment, they are spaced apart by a radial distance within a factor of 20 times the thickness of the conductors 610, 620. In some implementations, this distance may be as large as 30 times the conductor thickness or as little as a fraction of the conductor thickness.

Figure 7A:
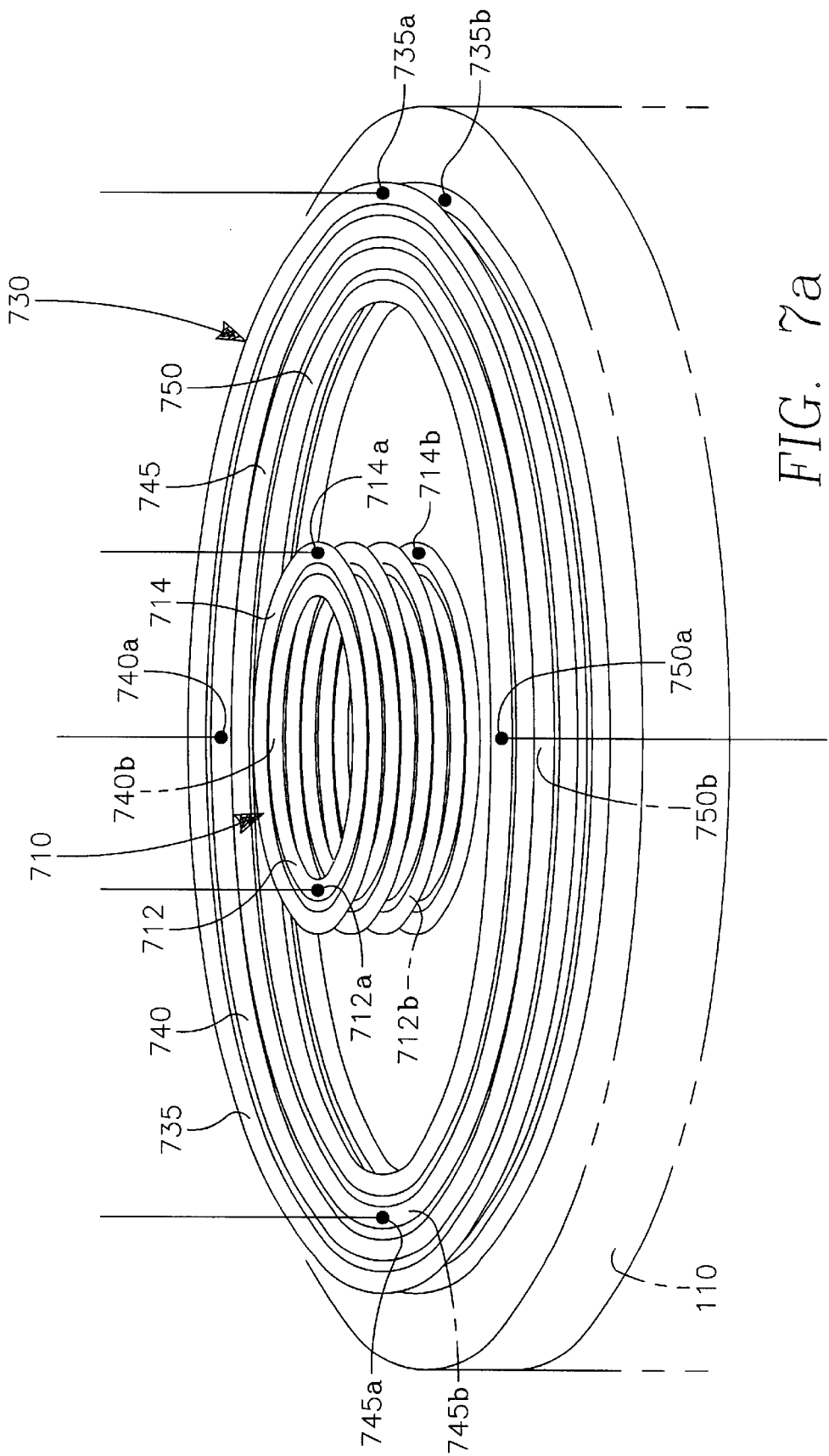
FIG. 7A illustrates a further embodiment of the invention having inner and outer solenoidal segmented conductor antennas.

FIG. 7A illustrates how two solenoidal segmented side by side plural conductor antennas of the type illustrated in FIGS. 6A and 6B may be used as the inner and outer antennas in lieu of the inner and outer antennas of FIG. 5. In FIG. 7A, an inner antenna 710 consists of a pair of side-by-side solenoidal conductors 712, 714 with power taps 712a, 714a at the top and return taps 712b, 714b at the bottom. An outer antenna 730 consists of four side-by-side solenoidal conductors 735, 740, 745, 750, each having a smaller number of conductors than those of the inner antenna 710. Their power taps 735a, 740a, 745a, 750a are at the top and their return taps 735b, 740b, 745b, 750b are at the bottom. The power taps of the inner and outer antennas 710, 730 are preferably connected to different power output terminals so that their power levels may be adjusted differentially. This may be accomplished using separate power supplies or a common power supply with separately or differentially adjustable outputs, as will be described below.

Figure 7B:
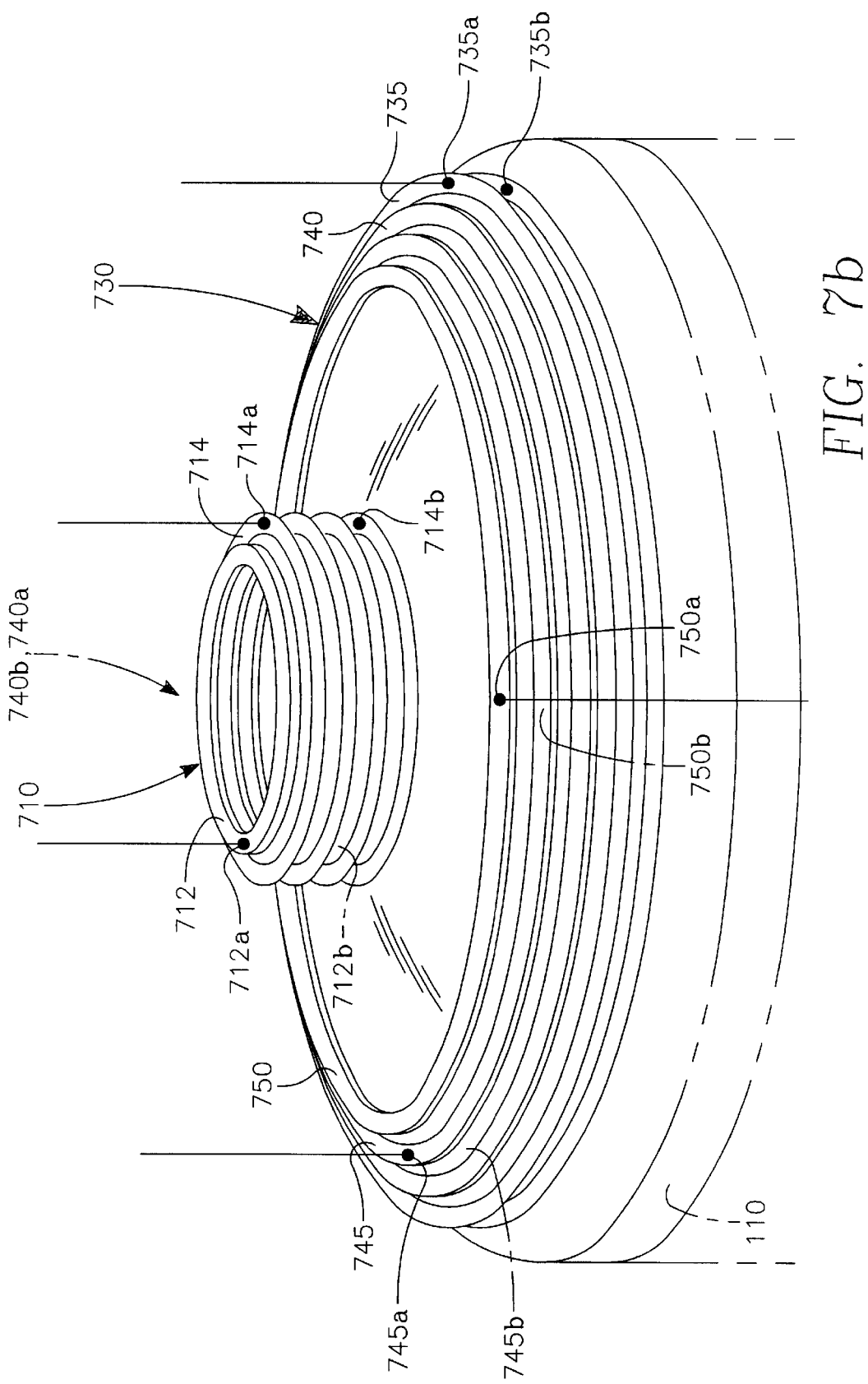
FIG. 7B illustrates a modification of the embodiment of FIG. 7A in which the coil antennas conform with a dome shape.

FIG. 7B illustrates a version of the embodiment of FIG. 7A in which the reactor chamber ceiling 110, rather than being flat as in the embodiment of FIG. 7A, is dome-shaped, and the segmented solenoidal inner and outer coil antennas 710, 730 conform to the dome-shaped ceiling 110 of FIG. 7B. Thus, each solenoidal coil 712, 714 of the inner antenna 710 and each solenoidal coil 735, 740 of the outer antenna 730 are wound in a conical helix or helical dome shape, in which the lower windings of each coil 712, 714, 735, 740 have a greater diameter than the higher windings of the coil. Preferably, the conical surface followed by the coils 712, 714, 735, 740 are congruent with the dome-shaped ceiling 110 of FIG. 7B.

Figure 8:
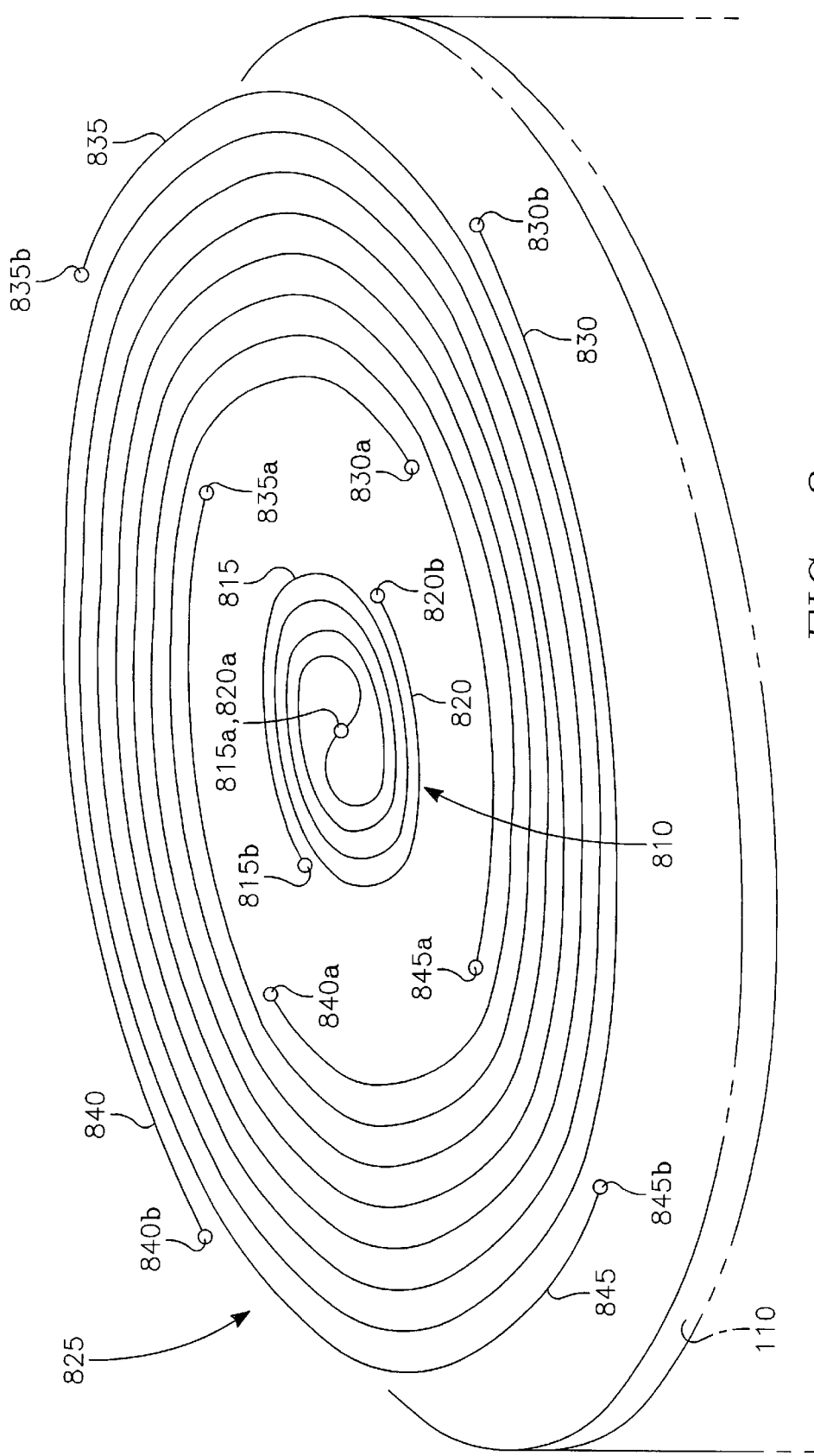
FIG. 8 illustrates yet another embodiment of the invention including an outer flat interleaved conductor coil antenna whose conductor lengths are tuned to more nearly match the impedance of the inner coil antenna.

Tuning Inner and Outer Flat Coil Antennas:

FIG. 8 illustrates how a flat version of the inner and outer interleaved coil antennas may be modified to tune them so as to bring their impedances nearer a match. As in the embodiment of FIG. 5, the inner antenna 810 of FIG. 8 has two interleaved conductors 815, 820, while the outer antenna 825 has four interleaved conductors 830, 835, 840, 845. The power taps 815a, 820a of the inner antenna are commonly connected while the ground taps 815b, 820b are disposed at 180 degree intervals. The power taps 830a, 835a, 840a, 845a of the outer antenna are disposed at 90 degree intervals, as are the outer antenna ground taps 830b, 835b, 840b, 845b. As in the embodiment of FIG. 5, the inner and outer antennas of FIG. 8 are nearly matched in impedance because the outer antenna has been provided as twice as many individual conductors as the inner antenna, whose lengths are therefore shortened proportionately to reduce their individual inductances without sacrificing the overall inductive coupling of the outer antenna.

As referred to above, a better impedance match between the inner and outer multiple conductor antennas 810, 825 facilitates numerous desireable advantages, including superior coupling of power into the plasma and a more practical adaptation to use with a common power source for both antennas. The same principles of improved impedance match should apply to inductive sources having plural antennas, each comprising multiple conductors, regardless of configuration, including both solenoidal and flat, as well as interleaved and segmented.

Solenoidal Interleaved Antennas With Dome Ceilings:

FIG. 9 illustrates how a plasma reactor in which the ceiling 110 is dome-shaped can have the cylindrical solenoidal inner and outer antennas 510, 525 of FIG. 5. In FIG. 9, the outer antenna 525 rests on an outer section of the dome ceiling and therefore is at a somewhat lower level than the inner antenna 510.

FIG. 10 illustrates a version of FIG. 9 in which the outer antenna 525 is modified to be a conformal antenna 525' that conforms with the sloping and nearly vertical surface of the outer section of the dome-shaped ceiling 110.

FIG. 11 illustrates a version of FIG. 9 in which the solenoid of the outer winding 525 is modified to be an antenna 525" having an inverted conical sectional shape to it so that the cross-section is perpendicular to the surface of the dome-shaped ceiling 110.

FIG. 12 illustrates a version of FIG. 10 in which the inner antenna 510 is replaced by a flat interleaved coil antenna 1200 of the type disclosed in the above-referenced patent to Qian et al.

Figure 13:
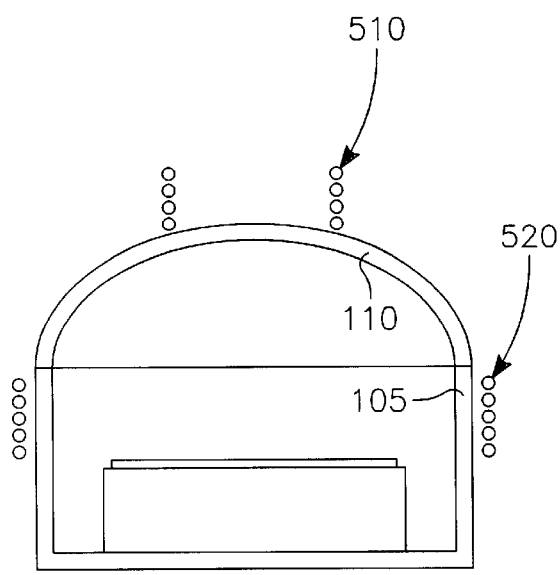

FIG. 13 illustrates a version of FIG. 9 in which the outer antenna 525 is placed at the level of the cylindrical side wall 105 so that it surrounds the side wall 105 rather than overlying the ceiling 110.

Figure 14:
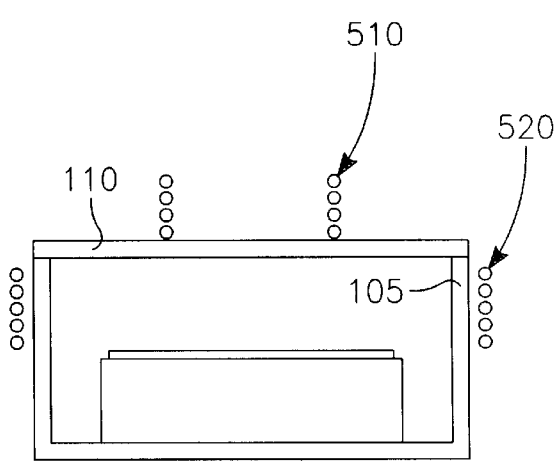
FIGS. 14 and 15 illustrated various configurations of solenoidal interleaved plural conductor coil antennas with plasma reactors having flat reactor chamber ceilings.

Solenoidal Interleaved Antennas with Flat Ceilings:

FIG. 14 illustrates a version of FIG. 13 in which the ceiling 110 is flat.

Figure 15:
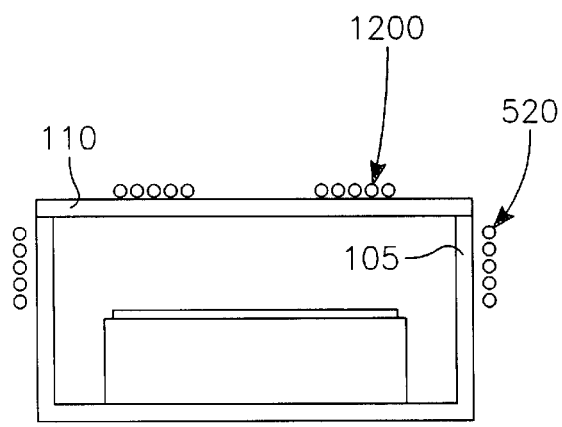

FIG. 15 illustrates a version of FIG. 14 in which the inner antenna is a flat interleaved parallel conductor coil antenna 1200 of FIG. 12.

Figure 16:
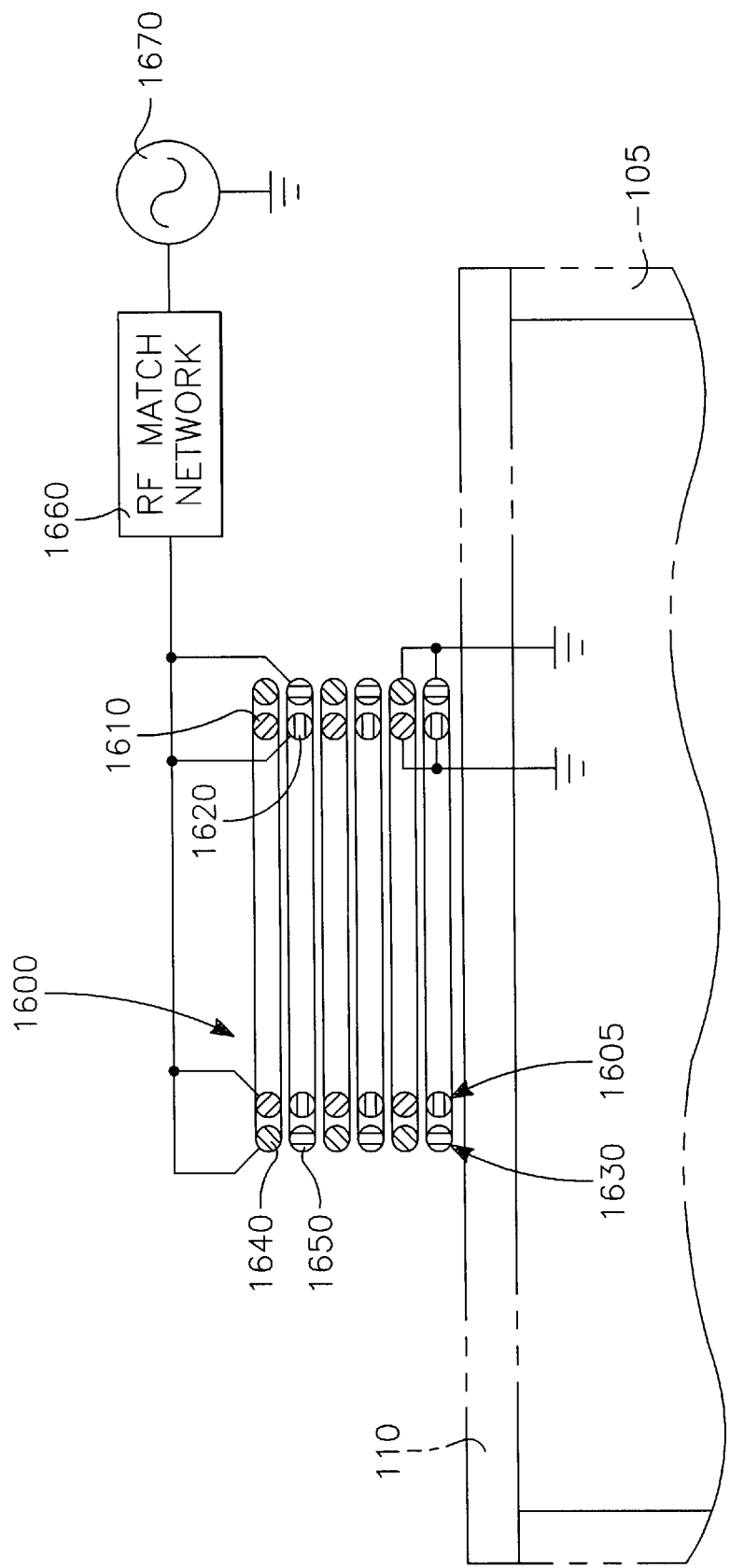
FIG. 16 illustrates an embodiment of the invention combining interleaving and segmenting of plural conductors in a single solenoidal coil antenna.

Combining Interleaving with Segmenting:

FIG. 16 illustrates a single solenoidal coil antenna 1600 having both the interleaving described above with reference to FIG. 1 and segmenting described above with reference to FIG. 6A. The antenna 1600 of FIG. 16 consists of an inner segment 1605 having two interleaved parallel conductors 1610, 1620. The inner segment 1605 is essentially a two-conductor version of the interleaved solenoidal coil of FIG. 1. The antenna of FIG. 16 further consists of an outer segment 1630 surrounding the inner segment 1605. The outer segment also has two interleaved parallel conductors 1640, 1650. The outer segment 1630 is also a two-conductor version of the interleaved solenoidal coil of FIG. 1. The top ends of each of the conductors in FIG. 16 are power taps, all of which are connected through an impedance match network 1660 to an RF power source 1670. The bottom ends of each of the conductors in FIG. 16 are return taps which are connected to ground.

Figure 17:
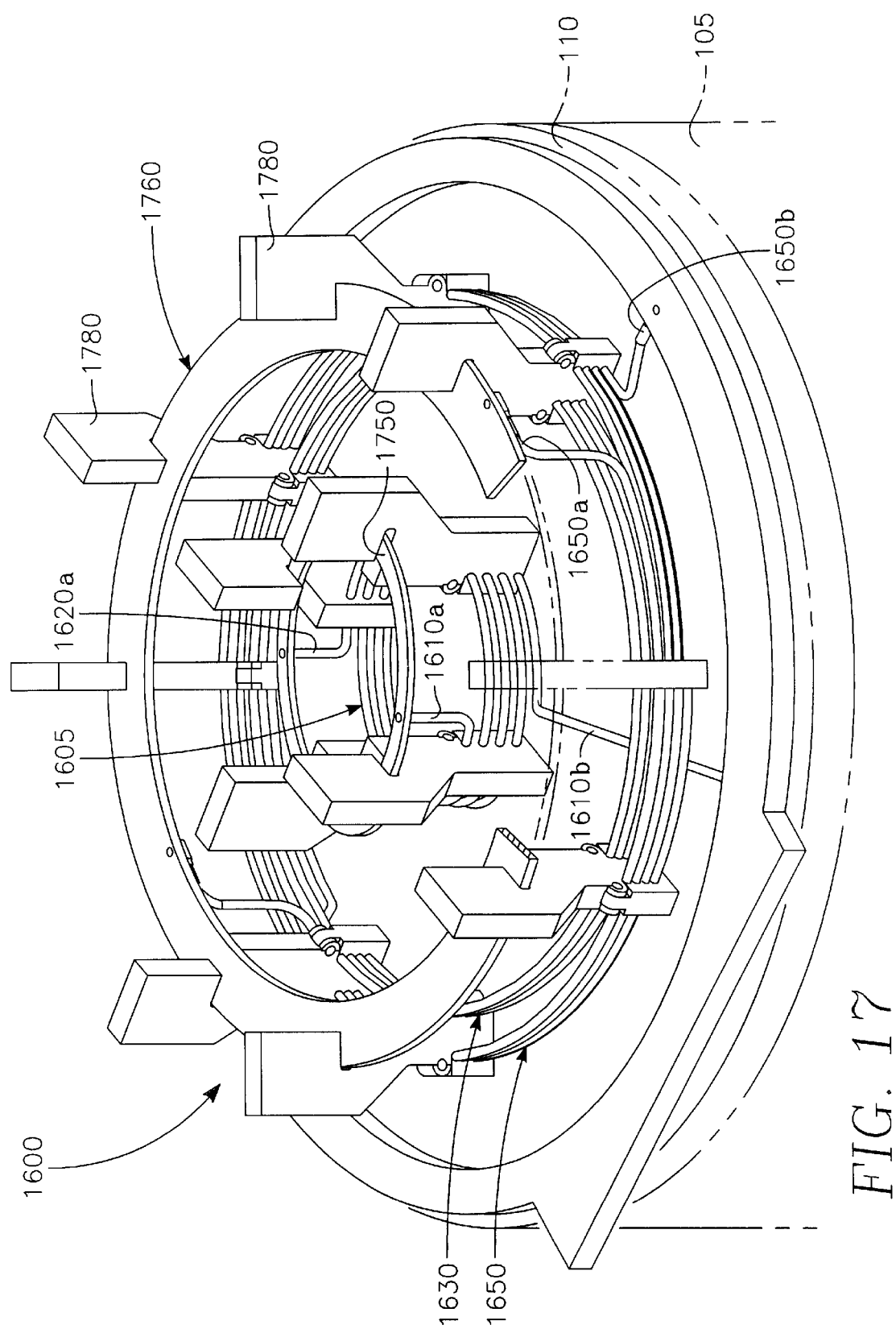
FIG. 17 illustrates a preferred embodiment of the invention having inner and outer coil antennas, in which the outer antenna is a solenoidal coil antenna of the type illustrated in FIG. 16 having interleaved and segmented conductors.

FIG. 17 illustrates a second illustrated embodiment of the invention similar to the embodiment of FIG. 5 except that the outer antenna 525 is replaced by the antenna 1600 of FIG. 16. The inner antenna 510 of FIG. 17 is the same as that described above with reference to FIG. 5.

FIG. 17 provides a perspective view that affords a more detailed view of the antenna 1600 than the elevational view of FIG. 16. FIG. 17 shows that the power and ground taps 1610a, 1610b of the inner segment's conductor 1610 are vertically aligned and are offset by 180 from the vertically aligned power and ground taps 1620a, 1620b of the inner segment's other inner antenna conductor 1620. Likewise, the power and ground taps 1640a, 1640b of the outer segment's conductor 1640 are vertically aligned and are offset by 180 from the vertically aligned power and ground taps 1650a, 1650b of the outer segment's other conductor 1650. Moreover, the taps of the inner segment 1605 are located at 90 relative to the taps of the outer segment 1630.

An inner annular power bus 1750 overlying the inner antenna 510 furnishes RF power to each of the power taps of the inner antenna 510. An outer annular power bus 1760 overlying both the inner and outer segments 1605, 1630 of the outer antenna furnishes RF power to each of the power taps of the segment 1605, 1630. Insulators 1780 support all of the windings as shown in FIG. 17.

Figure 18:
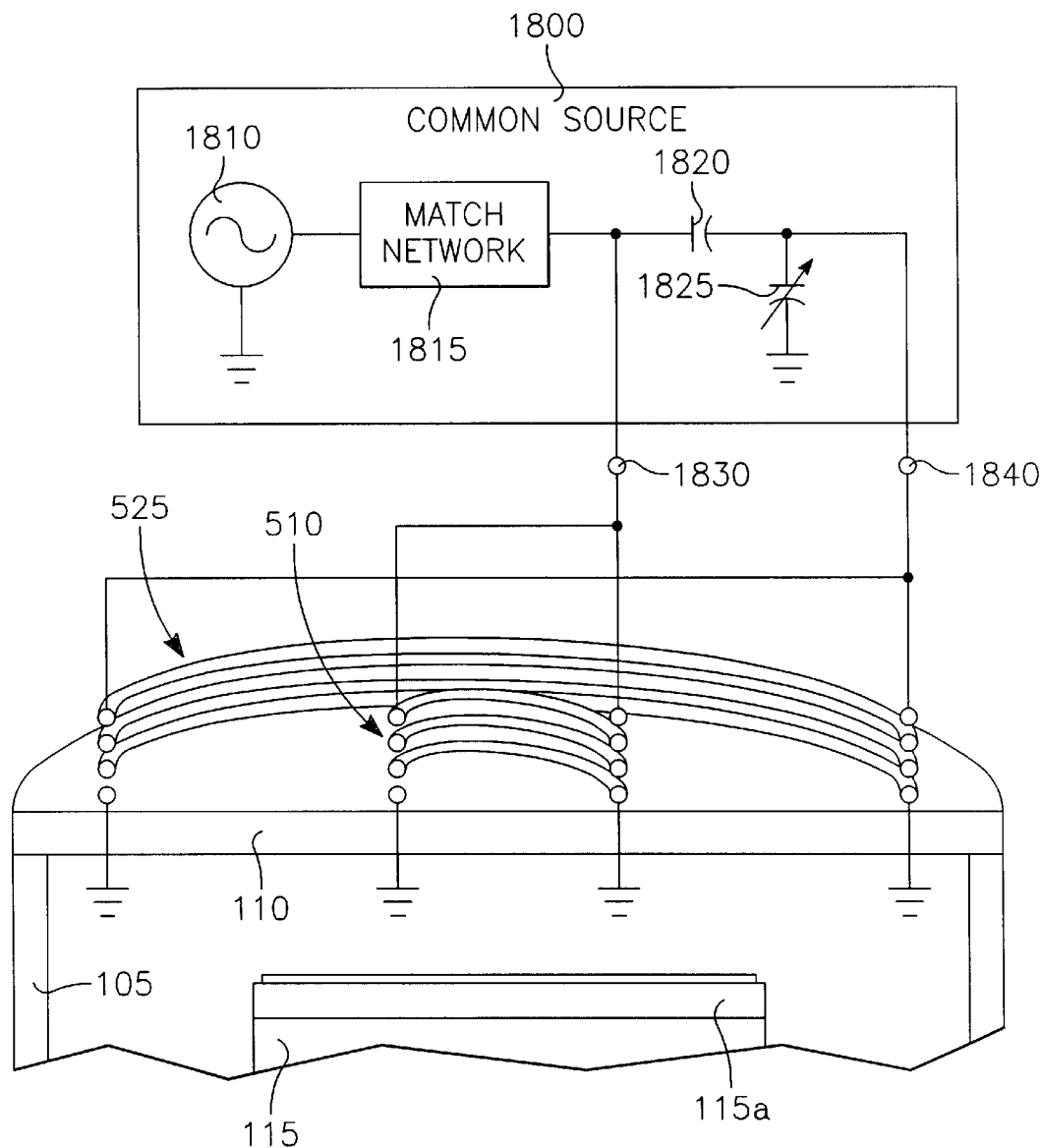
FIG. 18 illustrates a single power source having dual differentially adjustable outputs connected respectively to the inner and outer coil antennas of FIG. 5.
Figure 19:
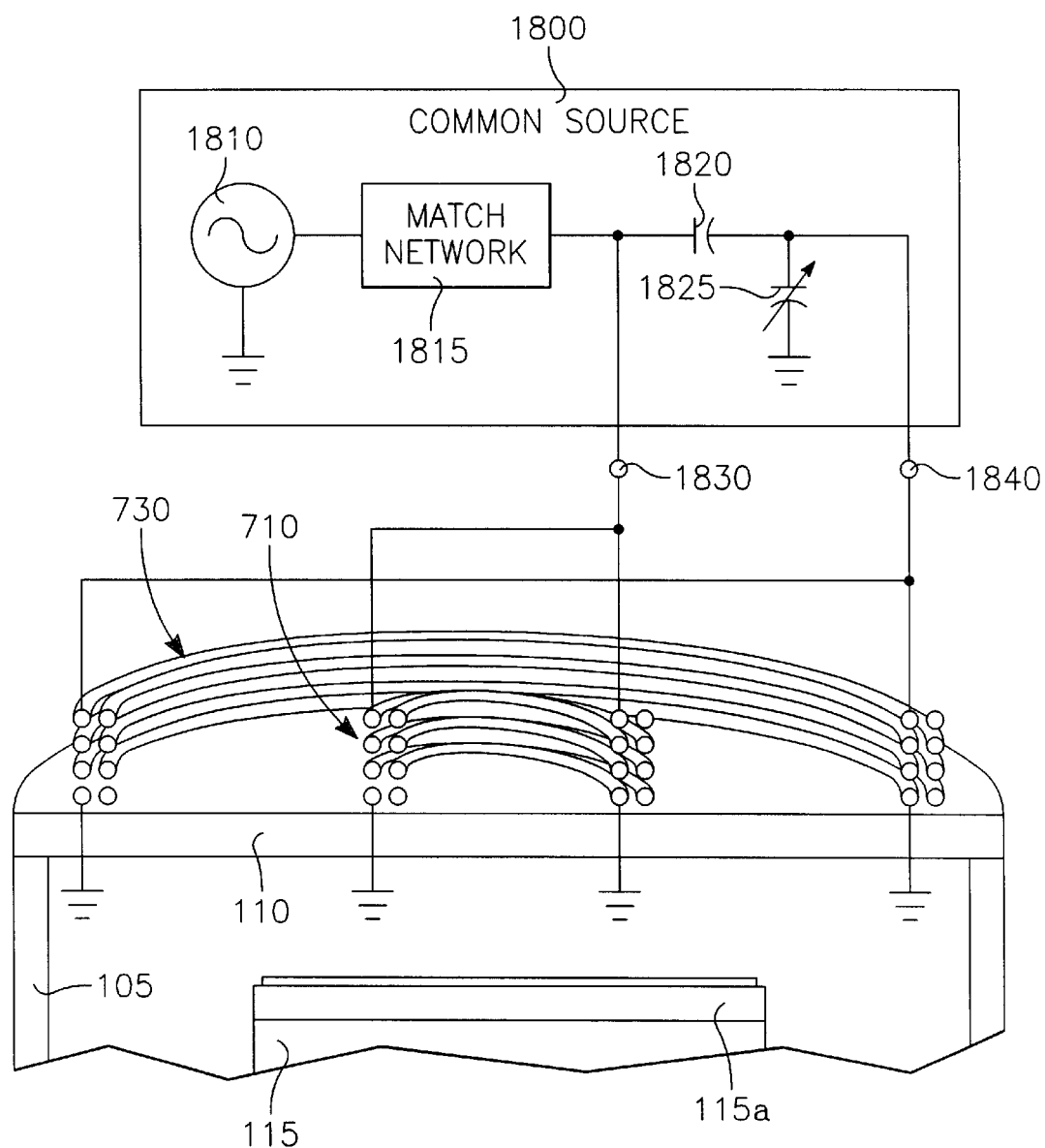
FIG. 19 illustrates dual output power source of FIG. 18 connected to the inner and outer coil antennas of FIG. 7.
Figure 20:
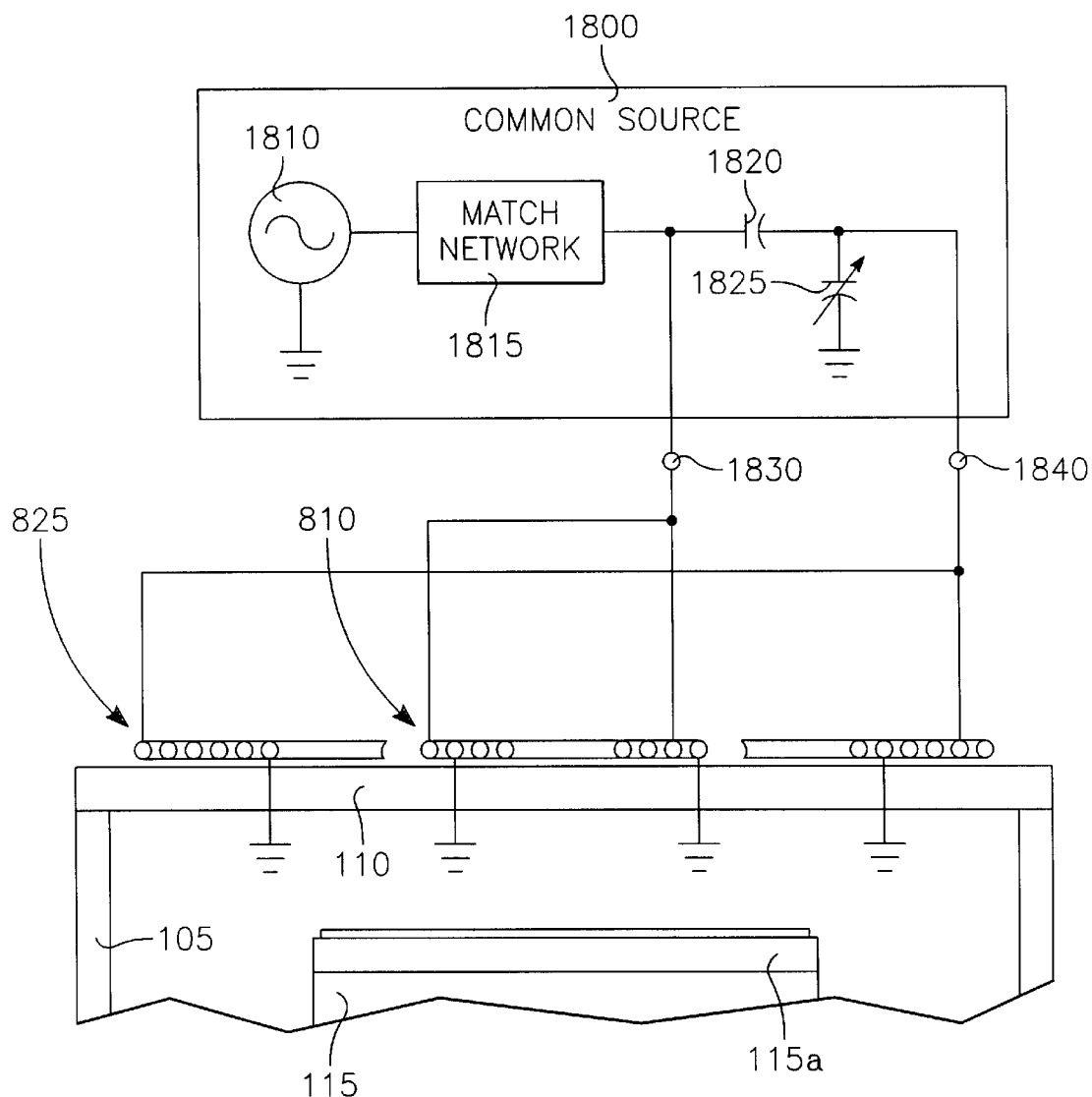
FIG. 20 illustrates the dual output power source of FIG. 18 connected respectively to the inner and outer coil antennas of FIG. 8.

An RF Power Source with Plural Differentially Adjustable Outputs:

A power source having at least two differentially adjustable power outputs has been referred to previously in this specification, and is disclosed in co-pending application Ser. No. 09/544,377 filed Apr. 6, 2000 by the inventors herein and entitled "Inductively Coupled Plasma Source with Controllable Power Deposition", the disclosure of which is hereby incorporated herein by reference in its entirety. FIG. 18 illustrates one embodiment of such a power source having dual outputs. In FIG. 18, an RF power source 1800 includes an RF generator 1810 connected through an impedance match network 1815 to a series capacitor 1820 and a variable shunt capacitor 1825. A first RF output terminal 1830 of the source 1800 is connected between the match network 1815 and the series capacitor 1820, while a second RF output terminal 1840 is connected to the opposite side of the series capacitor 1820. Adjusting the variable shunt capacitor 1825 apportions more power to one output terminal or the other, depending upon the adjustment. Thus, the power levels at the two output terminals is differentially adjustable. As illustrated in FIG. 18, the first output terminal 1830 is connected to the inner antenna 510 while the other output terminal 1840 is connected to the outer antenna 525 of FIG. 5. In FIG. 19, the terminals 1830, 1840 are connected to the inner and outer segmented parallel conductor antennas 710, 730, respectively, of FIG. 7. In FIG. 20, the output terminals 1830, 1840 are connected to the flat inner and outer interleaved coil antennas 810, 825, respectively, of FIG. 8. More generally, the dual output power source of FIG. 18 may be used with any plasma reactor having inner and outer antennas, with the terminal 1830 connected to the inner antenna and the terminal 1840 connected to the outer antenna. This is true of each of the reactors having inner and outer antennas described above with reference to FIGS. 9 through 15.

Figure 21:
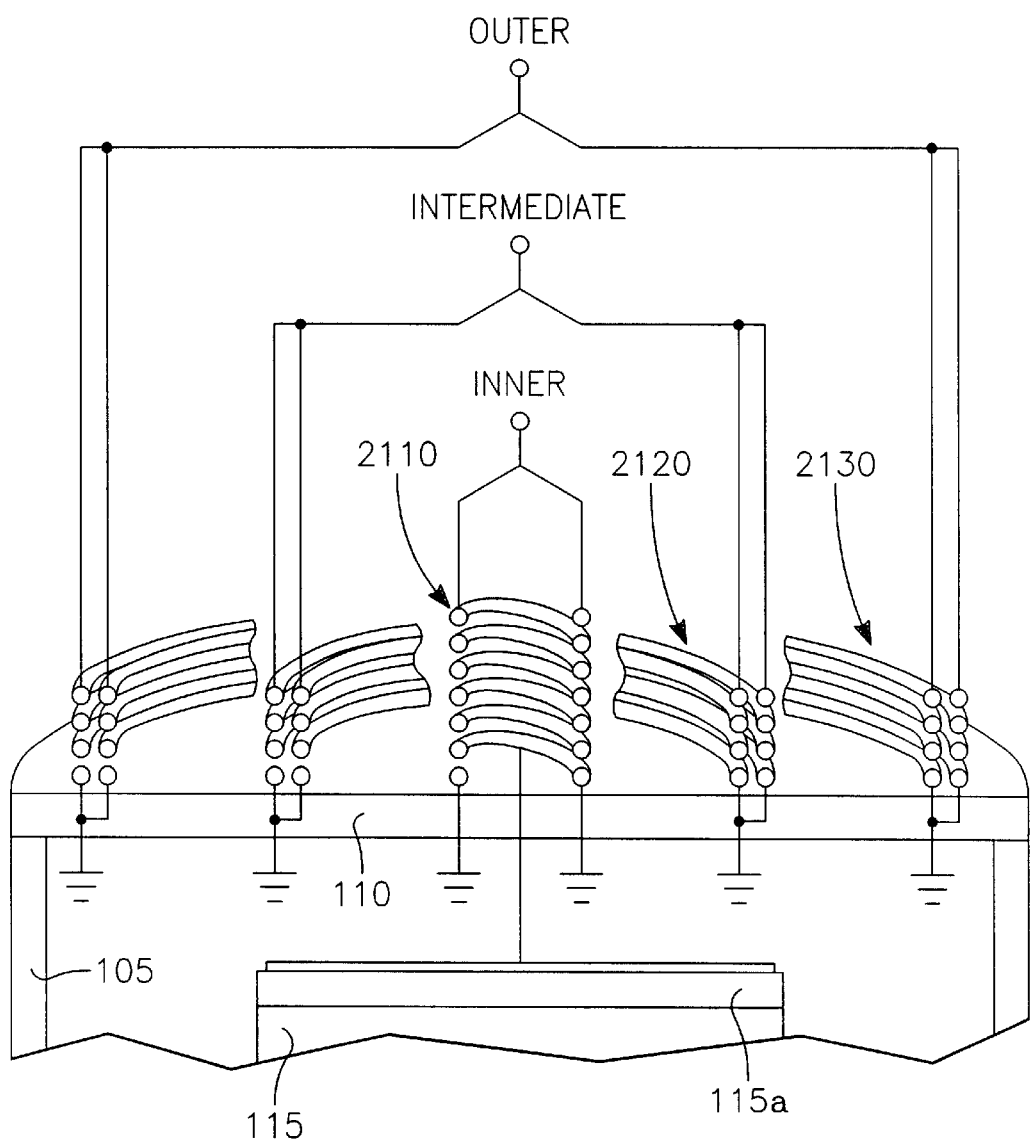
FIG. 21 illustrates a further embodiment of the invention having inner, intermediate and outer solenoidal plural conductor coil antennas.

The power source may have more than two differentially adjustable outputs for use with reactors having more than two antennas. For example, FIG. 21 illustrates a plasma reactor having three antennas, namely an inner antenna 2110, an intermediate antenna 2120 and outer antenna 2130. Each of these three antennas may be of any type of suitable coil antenna, such as a flat or solenoidal single conductor coil antenna, a flat or solenoidal interleaved parallel conductor antenna, solenoidal segmented parallel conductor antenna or a combination of different ones of the foregoing types. However, in the embodiment illustrated in FIG. 21, the inner antenna 2110 is the solenoidal interleaved parallel conductor antenna 210 of FIG. 2, and the intermediate antenna 2120 is the segmented and interleaved parallel conductor antenna 1600 of FIG. 16. Moreover, the outer antenna 2130 is a larger version of the segmented and interleaved parallel conductor antenna 1600 of FIG. 16.

Figure 22:
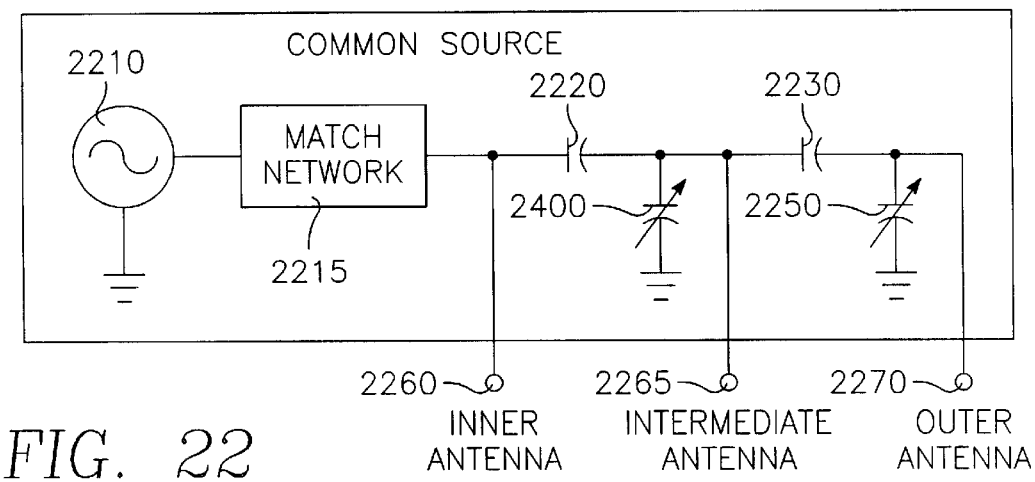
FIG. 22 illustrates a first embodiment of a differentially adjustable three-output RF power source for use with the reactor of FIG. 21.

FIG. 22 illustrates an RF power source with three differentially adjustable output terminals for use with a three-antenna plasma reactor such as the three-antenna plasma reactor of FIG. 21. The RF power source of FIG. 22 includes an RF power generator 2210 with a match network 2215, first and second series capacitors 2220, 2230 and first and second variable shunt capacitors 2240, 2250, the first variable shunt capacitor 2240 being connected across the first series capacitor and ground and the second shunt capacitor 2250 being connected across the second series capacitor 2230 and ground. A first output terminal 2260 is connected between the match network 2215 and the first series capacitor 2220. A second output terminal 2265 is connected between the first shunt capacitor 2240 and the second series capacitor 2230. A third output terminal 2270 is connected to the other side of the second series capacitor 2230. Preferably, the first output terminal 2260 is connected to the power taps of the inner antenna 2110 of FIG. 21, the second output terminal 2265 is connected to the power taps of the intermediate antenna 2110 while the third output terminal 2270 is connected to the power taps of the outer antenna 2130.

Figure 23:
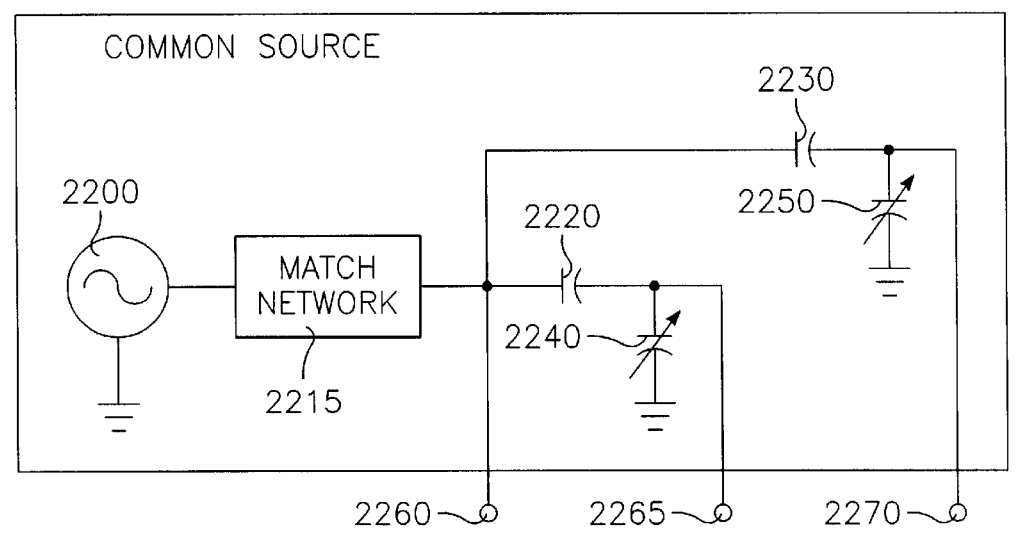
FIG. 23 illustrates a second embodiment of a differentially adjustable three-output RF power source for use with the reactor of FIG. 21.

FIG. 23 illustrates a modified version of the three-terminal RF power source of FIG. 22, in which the first series and shunt capacitors 2220, 2240 are connected in parallel with the second series and shunt capacitors 2230, 2250.

In practice, the variable shunt capacitors 2240, 2250 are adjusted to apportion different RF power levels to the inner, intermediate and outer antennas until the desired radial distribution of the applied RF field or of the plasma ion density is achieved. The particular radial distribution to be achieved depends upon the process being performed. For example, certain processes require a uniform distribution. Other processes, such as aluminum etch, produce non-uniform gas or ion distributions across the wafer surface, which can be compensated for by selecting an appropriate non-uniform radial distribution of the applied RF field. This selection is carried out by adjustment of the variable shunt capacitors 2230, 2250.

Figure 24:
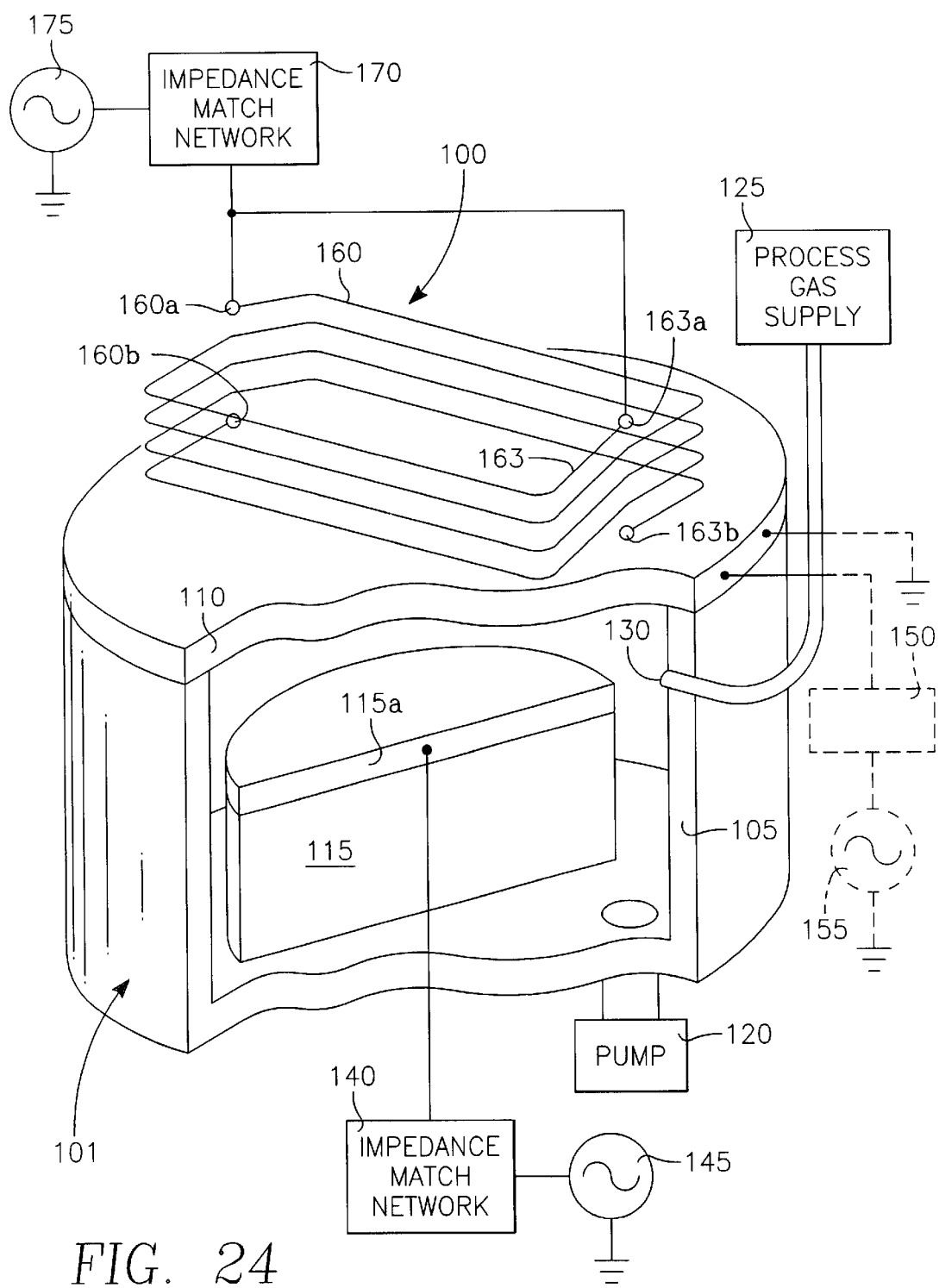
FIG. 24 illustrates a version of the embodiment of FIG. 1 in which the coil antenna is rectangular rather than circular.

FIG. 24 illustrates a version of the embodiment of FIG. 1 in which the coil antenna 100 including the coiled conductors 160, 163, 166 are rectangular about the axis of symmetry rather than being circular as in the embodiment of FIG. 1. This embodiment may be better adapted to processing flat panel displays or the like.

Advantages of the Disclosed Embodiments:

A number of problems in the art that have plagued plasma reactor performance have now been overcome. The solenoidal feature of the invention increases the efficiency of the antenna because each conductor segment is displaced from its nearest neighbor conductor segment generally in the axial direction. In this way the magnetic lines attributable to mutual coupling between the conductor segments are in the vertical direction, so that they advantageously reach toward the plasma in the reactor chamber. Thus, coupling to the plasma is enhanced relative to designs in which the coils are flat with mutual coupling in the direction perpendicular to the chamber axis.

Vertical solenoidal interleaved plural conductor inner and outer antennas have virtually no radial width beyond that of the thin conductors themselves. Thus, for example, a majority of the RF power applied to the outer antenna radiates into the chamber from the single discrete radius of the outer antenna, so that none of it is "wasted" at interior radial locations as in the conventional antenna mentioned above. The same is true of the inner antenna in that a majority of the RF power applied to the inner antenna radiates from the single discrete radius of the inner antenna. Thus, none of it is "wasted" at exterior radial locations. As a result, for a given range of differences in applied power levels on the inner and outer antennas, a much greater shift in radial distribution of plasma ion density is realized than is possible in the conventional case.

This aspect of the invention is particularly advantageous in providing uniform and/or adjustable plasma ion distribution across a very large wafer surface. Thus, the chamber size is readily scalable up to large diameter wafers using the inner/outer antenna structure. Moreover, even greater scalability is attained by employing an even greater number of antennas, e.g., an intermediate antenna between the inner and outer antennas.

The problem of the disparity between impedances of the inner and outer antennas is overcome by adjusting the length and number of the plural conductors in the interleaved coils of the inner and outer antennas. The outer antenna is divided into a greater number of interleaved conductors than the inner antenna. Moreover, each of the conductors of the outer antenna is proportionately shorter. The proportion of the number of interleaved conductors and conductor lengths between the inner and outer antennas is sufficient to reduce the disparity between the impedances of the inner and outer antennas. Thus, the problem is solved by reducing the inductance (length) of each individual conductor in the outer antenna relative to the inner antenna. In order to avoid a concomitant reduction in the overall inductive coupling of the outer antenna, a greater number of individual conductors is provided in the outer antenna than in the inner antenna. The greater number of individual conductors enhances inductive coupling in order to compensate for the shortened conductor length in the outer antenna.

With the inner and outer antenna impedances matched or nearly matched, a common power source to drive both antennas can be used without encountering impedance match problems. A illustrated embodiment of the invention employs a common power source having multiple outputs with differentially adjustable power levels to permit the sculpting of the radial distribution of plasma ion density.

As an alternative to the interleaved plural conductor antenna, the segmented plural conductor antenna enjoys the advantages of the interleaved conductor antenna and can be implemented in the various configuration disclosed above including solenoidal or dome shaped. Moreover, the segmented feature can be combined with the interleaved feature in accordance with certain illustrated embodiments disclosed above.

The solenoidal interleaved and segmented conductor antennas disclosed above preferably include co-planar power taps in one (e.g., an upper) plane and co-planar return taps in another (e.g., a lower) plane. For each one of the plural conductors of a given antenna, its power tap and its return tap advantageously are vertically aligned (or more generally, aligned along the axis of the coil antenna), thus advantageously simplifying the configuration of the antenna.

Thus, for the first time, several and indeed all of the foregoing advantages can be provided simultaneously in the same plasma source.

While the invention has been described in detail by specific reference to illustrated embodiments, it is understood that variations and modifications thereof may be made without departing from the true spirit and scope of the invention.

What is claimed is:

1. A plasma reactor for processing a workpiece, said reactor comprising:
   a vacuum chamber having a ceiling and defining an axis of symmetry;
   a workpiece support pedestal within the chamber;
   an outer coil antenna adjacent the chamber, said outer coil antenna comprising a first plurality of conductors wound symmetrically about the axis;

an inner coil antenna adjacent the chamber, said inner coil antenna comprising a second plurality of conductors wound symmetrically about the axis;

wherein the number of said first plurality of conductors is greater than the number of said second plurality of conductors; and an RF plasma source power supply, the conductors in at least one of said first and second pluralities of conductors being connected in parallel across said RF plasma source power supply.

2. The reactor of claim 1 wherein the conductors within each of said pluralities of conductors are generally mutually parallel.

3. The reactor of claim 1 wherein at least said outer antenna is an interleaved parallel conductor coil antenna.

4. The reactor of claim 3 wherein at least said outer antenna is flat in a plane generally parallel to that of said ceiling.

5. The reactor of claim 3 wherein at least said outer antenna is dome shaped.

6. The reactor of claim 3 wherein at least said outer antenna is solenoidal.

7. The reactor of claim 1 wherein at least said outer antenna is a solenoidal segmented parallel conductor coil antenna.

8. The reactor of claim 1 further comprising independent RF plasma source power supplies connected to said inner and outer coil antennas, respectively, whereby the respective RF power levels applied to said inner and outer antennas are differentially adjustable to control radial distribution of the applied RF field from said inner and outer antennas.

9. The reactor of claim 1 wherein said RF plasma source power supply has two RF outputs having differentially adjustable power levels, one of said two RF outputs being connected to said outer antenna and the other being connected to said inner antenna, whereby the respective RF power levels applied to said inner and outer antennas are differentially adjustable to control radial distribution of the applied RF field from said inner and outer antennas.

10. The reactor of claim 9 wherein said RF plasma source power supply comprises:

an RF power generator having an output terminal and a return terminal;

a series capacitor;

an impedance match element connected between said RF power generator output terminal and one side of said series capacitor;

a variable shunt capacitor connected between the other side of said series capacitor and said return terminal;

a first output node connected at the junction between said impedance match element and said series capacitor; and a second output node connected at the junction between said series capacitor and said variable shunt capacitor.

11. The reactor of claim 9 further comprising an intermediate coil antenna between said inner and outer coil antennas, said RF source power supply comprising a third differentially adjustable RF output.

12. The reactor of claim 11 wherein said RF plasma source power supply comprises:

an RF power generator having an output terminal and a return terminal;

a first series capacitor;

an impedance match element connected between said RF power generator output terminal and one side of said series capacitor;

a first variable shunt capacitor connected between the other side of said series capacitor and said return terminal;

a second series capacitor having one side connected to the junction between said first series and shunt capacitors;

a second variable shunt capacitor connected between the other side of said second series capacitor and said RF return;

a first output node connected at the junction between said impedance match element and said first series capacitor;

a second output node connected at the junction between said first series capacitor and said first variable shunt capacitor; and a third output node connected at the junction between said second series capacitor and said second variable shunt capacitor.

13. The reactor of claim 1 wherein said inner and outer antennas are circular.

14. The reactor of claim 1 wherein said inner and outer antennas are rectangular.

15. The reactor of claim 1 wherein said inner antenna overlies at least an intermediate portion of said ceiling.

16. The reactor of claim 1 further comprising a process gas distribution inlet for supplying process gas into said chamber.

17. The reactor of claim 1 wherein at least one of said inner and outer antenna is a segmented plural conductor antenna.

18. The reactor of claim 1 wherein the lengths of said first plurality of conductors are shortened accordingly, so as to bring the inductive reactance of said outer antenna at least nearer that of said inner antenna.

19. The reactor of claim 1 wherein said workpiece support generally faces said ceiling.

20. The reactor of claim 1 wherein said outer antenna has a radius greater than that of said inner antenna.

21. The reactor of claim 1 wherein each conductor defines two ends, and wherein the ends of said first plurality of conductors are in axial alignment with respective ends of said second plurality of conductors.

22. The reactor of claim 1 wherein each conductor defines first and second ends, and wherein the first ends of at least said first plurality of conductors are azimuthally equally spaced and the second ends of at least said first plurality of conductors are azimuthally equally spaced.

23. The reactor of claim 1 wherein at least one of said inner and outer antennas defines a right cylinder.

24. The reactor of claim 1 wherein the conductors within said first plurality of conductors are helical and are side-by-side.

25. The reactor of claim 24 wherein the conductors within said second plurality of conductors are helical and are side-by-side.

* * * * *